United States Patent
Lee et al.

(10) Patent No.: US 9,893,123 B2
(45) Date of Patent: Feb. 13, 2018

(54) IMAGE SENSOR INCLUDING PHOTOELECTRIC CONVERSION DEVICES

(71) Applicant: SAMSUNG ELECTRONICS CO., LTD., Suwon-si, Gyeonggi-do (KR)

(72) Inventors: Tae-yon Lee, Seoul (KR); Kyoung-won Na, Seoul (KR); Jung-chak Ahn, Yongin-si (KR); Myung-won Lee, Hwaseong-si (KR); Joo-yeong Gong, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/377,424

(22) Filed: Dec. 13, 2016

(65) Prior Publication Data
US 2017/0170239 A1   Jun. 15, 2017

(30) Foreign Application Priority Data
Dec. 14, 2015   (KR) .......................... 10-2015-0178523

(51) Int. Cl.
*H01L 27/30* (2006.01)
*H01L 51/44* (2006.01)
(52) U.S. Cl.
CPC .......... *H01L 27/307* (2013.01); *H01L 51/441* (2013.01); *H01L 51/447* (2013.01)

(58) Field of Classification Search
CPC ............... H01L 27/307; H01L 27/3269; H01L 27/14643
See application file for complete search history.

(56) References Cited

U.S. PATENT DOCUMENTS

| | | |
|---|---|---|
| 8,106,984 B2 | 1/2012 | Takeuchi et al. |
| 8,274,587 B2 | 9/2012 | Hynecek |
| 8,736,735 B2 | 5/2014 | Shinohara |
| 8,773,562 B1 | 7/2014 | Fan |
| 8,792,035 B2 | 7/2014 | Yamada |
| 9,041,071 B2 | 5/2015 | Ahn |
| 9,111,835 B2 | 8/2015 | Kido et al. |
| 2007/0131987 A1 | 6/2007 | Kim |
| 2014/0320718 A1 | 10/2014 | Fan |
| 2015/0155328 A1 | 6/2015 | Park et al. |
| 2016/0247848 A1* | 8/2016 | Nakamura ........ H01L 27/14614 |

FOREIGN PATENT DOCUMENTS

KR   2000-0046221 A   7/2000

* cited by examiner

*Primary Examiner* — Hoai V Pham
(74) *Attorney, Agent, or Firm* — Lee & Morse, P.C.

(57) ABSTRACT

An image sensor includes a substrate comprising a first face and a second surface which faces the first surface and on which light is incident, a semiconductor photoelectric conversion device on the substrate, a gate electrode located between the first surface of the substrate and the semiconductor photoelectric conversion device and extending in a first direction perpendicular to the first surface, and an organic photoelectric conversion device stacked on the second surface of the substrate.

20 Claims, 21 Drawing Sheets

IMAGE SENSOR INCLUDING PHOTOELECTRIC CONVERSION DEVICES

CROSS-REFERENCE TO RELATED APPLICATION

Korean Patent Application No. 10-2015-0178523, filed on Dec. 14, 2015, in the Korean Intellectual Property Office, and entitled: "Image Sensor," is incorporated by reference herein in its entirety.

BACKGROUND

1. Field

Embodiments relate to an image sensor, and more particularly, to an image sensor including a photoelectric converter having a light-receiving surface with an improved fill factor.

2. Description of the Related Art

An image sensor converts a captured image into an electrical signal. The image sensor may include a pixel array, and each pixel included in the pixel array may include a light-sensing device. In addition to the light sensing device, the image sensor may include a transistor for controlling the light sensing device and circuits for driving the light sensing device.

SUMMARY

One or more embodiments provide an image sensor including: a substrate including a first face and a second surface which is opposite to the first surface and on which light is incident; a semiconductor photoelectric conversion device on the substrate; a gate electrode located between the first surface of the substrate and the semiconductor photoelectric conversion device and extending in a first direction perpendicular to the first surface; and an organic photoelectric conversion device stacked on the second surface of the substrate.

One or more embodiments provide an image sensor including: a substrate including a first face, a second surface which is opposite to the first surface and on which light is incident, and a plurality of pixel areas; semiconductor photoelectric conversion devices each formed in the plurality of pixel areas of the substrate; gate electrodes located between the first surface and the semiconductor photoelectric conversion devices and extending in a first direction perpendicular to the first surface in the substrate; first floating diffusions respectively adjacent to the gate electrodes on the first surface and respectively electrically connected to the gate electrodes in the substrate; and organic photoelectric conversion devices on the second surface, wherein the semiconductor photoelectric conversion devices electrically share the first floating diffusions.

One or more embodiments provide an image sensor including, a substrate having a first surface and a second surface, opposite to the first surface along a first direction, on which light is incident, a semiconductor photoelectric conversion device on the substrate and extending in a second direction orthogonal to the first direction, a gate electrode located between the first surface of the substrate and the semiconductor photoelectric conversion device, the gate electrode extending in the first direction, and an organic photoelectric conversion device on the second surface of the substrate and extending in the second direction.

BRIEF DESCRIPTION OF THE DRAWINGS

Features will become apparent to those of skill in the art by describing in detail exemplary embodiments with reference to the drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 1:
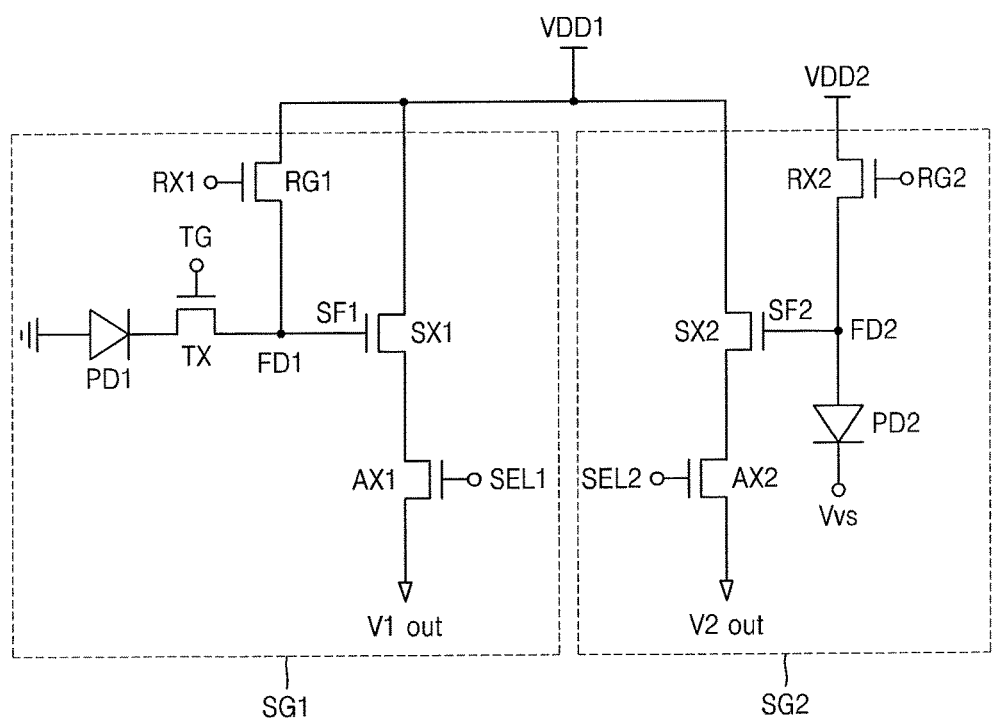
FIG. 1 illustrates a circuit diagram of a pixel included in an image sensor according to embodiments.

FIG. 1 illustrates a circuit diagram of a pixel 100 included in an image sensor according to embodiments. Each pixel included in a pixel array in the image sensor may include an element for amplifying an electric signal converted by first and second photoelectric conversion devices PD1 and PD2. In other words, the pixel 100 may include the photoelectric conversion devices PD1 and PD2, a transfer transistor TX, first and second reset transistors RX1 and RX2, first and second source follower transistors SX1 and SX2, and first and second selection transistors AX1 and AX2.

Referring to FIG. 1, the pixel 100 included in the image sensor may include a first photoelectric signal generator SG1 and a second photoelectric signal generator SG2. The first photoelectric signal generator SG1 and the second photoelectric signal generator SG2 may respectively include the first and second photoelectric conversion devices PD1 and PD2. The first and second photoelectric conversion devices PD1 and PD2 may be elements for detecting light having wavelengths different from each other. Additionally, the first photoelectric signal generator SG1 may have a four transistor (4T) structure including the transfer transistor TX electrically connected to the first photoelectric conversion device PD1. The second photoelectric signal generator SG2 may have a three transistor (3T) structure that does not include a transfer transistor connected to the second photoelectric conversion device PD2.

In detail, the first photoelectric signal generator SG1 may include the first photoelectric conversion device PD1, the transfer transistor TX, the first source follower transistor SX1, the first reset transistor RX1, and the first selection transistor AX1. The transfer transistor TX, the first source follower transistor SX1, the first reset transistor RX1, and the first selection transistor AX1 may respectively include a transfer gate TG, a first source follower gate SF1, a first reset gate RG1, and a first selection gate SEL1.

The first photoelectric conversion device PD1 may be connected to a source of the transfer transistor TX. A drain of the transfer transistor TX may be a first floating diffusion FD1. The first floating diffusion FD1 may be a source of the first reset transistor RX1. The first floating diffusion FD1 may be electrically connected to the first source follower gate SF1 of the first source follower transistor SX1. The first source follower transistor SX1 is connected to the first selection transistor AX1. The first reset transistor RX1, the source follower transistor SX1, and the first selection transistor AX1 may be shared by pixels neighboring the pixel 100, and thus, a degree of integration may increase This will be described in detail with reference to FIG. 6.

The first photoelectric conversion device PD1 may be a photo diode including an N-type impurity area and a P-type impurity area. The first photoelectric conversion device PD1 may be a light sensing device in which a photocurrent linearly increases with a strength of light input in a reverse bias state. In other words, if the first photoelectric conversion device PD1 is exposed to light and electrically floats relative to the outside, electrons may accumulate therein. As the electrons accumulate, a cathode voltage of the first photoelectric conversion device PD1 may decrease. A strength of light absorbed by the first photoelectric conversion device PD1 may be detected by measuring the decreased cathode voltage. An accumulation process of the electrons may be similar to a process when a capacitor charged with a photocurrent is discharged.

The transfer transistor TX may connect or disconnect the first photoelectric conversion device PD1 to or from the first floating diffusion FD1 according to a voltage of the transfer gate TG. While the first photoelectric conversion device PD1 accumulates electrons in response to light, the transfer transistor TX may be turned off, and thus, the first photoelectric conversion device PD1 may be electrically disconnected from the first floating diffusion FD1. If the first photoelectric conversion device PD1 finishes absorbing light, the transfer transistor TX may be turned on. Thus, a voltage changed by the electrons accumulated in the first photoelectric conversion device PD1 may be transmitted to the first floating diffusion FD1, so as to output the changed voltage of the first photoelectric conversion device PD1.

In detail, before the changed voltage of the first photoelectric conversion device PD1 is transmitted to the first floating diffusion FD1, the first floating diffusion FD1 may be reset. In other words, electric charges remaining in the first floating diffusion FD1 may be discharged by applying a first power voltage VDD1 to a drain of the first reset transistor RX1 and a drain of the source follower transistor SX1, and turning the first reset transistor RX1 on when light is obstructed. A reset voltage of the first floating diffusion FD1 is amplified via the first source-follower transistor SX1, and may be output to the outside when the first selection transistor AX1 is turned on. An analog voltage corresponding to the reset voltage of the first floating diffusion FD1 may be transmitted to an external lead circuit.

Then, when an output of the reset voltage of the first floating diffusion FD1 is finished, as the first reset transistor RX1 is turned off, and the transfer transistor TX is turned on, a voltage changed by electric charges accumulated by the first photoelectric conversion device PD1 may be transmitted to the first floating diffusion FD1. The changed voltage of the first floating diffusion FD1 may be output to the outside via the first source follower transistor SX1 and the first selection transistor AX1. A first analog voltage V1out corresponding to the changed voltage of the first floating diffusion FD1 may be transmitted to an external lead circuit. An order in which the reset voltage and the voltage of the first photoelectric conversion device PD1 are received may be changed.

The lead circuit may receive a reset voltage of the first floating diffusion FD1 and the voltage of the first photoelectric conversion device PD1, and calculate an amount of light detected by the first photoelectric conversion device PD1 based on a difference between the reset voltage and the voltage of the first photoelectric conversion device PD1.

The second photoelectric signal generator SG2 may be different from the first photoelectric signal generator SG1 in that the second photoelectric signal generator SG2 may include an organic photoelectric conversion device and, accordingly, may not include a transfer transistor connected to the second photoelectric conversion device PD2.

In detail, the second photoelectric signal generator SG2 may include the second photoelectric conversion device PD2, the second source follower transistor SX2, the second reset transistor RX2, and the second selection transistor AX2. The second source follower transistor SX2, the second reset transistor RX2, and the second selection transistor AX2 may respectively include a second source follower gate SF2, a second reset gate RG2, and a second selection gate SEL2.

The second photoelectric conversion device PD2 may be connected to a source of the control voltage Vvs so that a voltage bias may be separately applied to the second photoelectric conversion device PD2. Additionally, the second photoelectric conversion device PD2 may be connected to the second floating diffusion FD2. The second flowing diffusion FD2 may be a source of the second reset transistor RX2. The second floating diffusion FD2 may be electrically connected to the second source follower gate SF2 of the second source follower transistor SX2. The second source follower transistor SX2 is connected to the second selection transistor AX2.

The second photoelectric conversion device PD2 may be an organic photoelectric conversion device. Like the first photoelectric conversion device PD1, the second photoelectric conversion device PD2 may be a light sensing device. In other words, if the second photoelectric conversion device PD2 is exposed to light and electrically disconnected from the outside, electrons may accumulate in the second photoelectric conversion device PD2 and, accordingly, the second photoelectric conversion device PD2 may detect a strength of absorbed light.

In detail, before a changed voltage of the second photoelectric conversion device PD2 is transmitted to the second floating diffusion FD2, the second floating diffusion FD2 may be reset. In other words, when light is obstructed, a second power voltage VDD2 may be applied to a drain of the second reset transistor RX2 and a first power voltage VDD1 may be applied to a drain of the second source follower transistor SX2. Then, the second reset transistor RX2 may be turned on so as to discharge electric charges remaining in the second floating diffusion FD2. A reset voltage of the second floating diffusion FD2 may be amplified via the second source-follower transistor SX2. Then, if the second selection transistor AX2 is turned on, the reset voltage may be output to the outside. An analog voltage corresponding to the reset voltage of the second floating diffusion FD2 may be transmitted to an external lead circuit.

Then, a voltage changed by electric charges accumulated by the second photoelectric conversion device PD2 may be transmitted to the second floating diffusion FD2. The changed voltage of the second floating diffusion FD2 may output to the outside via the second source follower transistor SX2 and the second selection transistor AX2. A second analog voltage V2out corresponding to the changed voltage of the second floating diffusion FD2 may be transmitted to an external lead circuit.

The lead circuit may receive a reset voltage of the second floating diffusion FD2 and the changed voltage of the second photoelectric conversion device PD2, and calculate an amount of light detected by the second photoelectric conversion device PD2 based on a difference between the reset voltage and the changed voltage of the second photoelectric conversion device PD2.

Since the pixel 100 has a structure in which the first and second photoelectric conversion devices PD1 and PD2, which detect light having wavelengths different from each other, are stacked with each other, an area of the pixel 100 may decrease. Accordingly, the image sensor may accurately detect light having various wavelengths with a high resolution, and thus, performance of the image sensor may improve.

However, an area of a light-receiving surface of the stacked photoelectric conversion devices PD1 and PD2 may decrease due to wirings of each of the photoelectric conversion devices PD1 and PD2. Particularly, an area of a light-receiving surface of the first photoelectric conversion device PD1, formed on a lower layer from among layers of the stacked photoelectric conversion devices PD1 and PD2, may decrease.

According to embodiments, in the pixel 100, the second photoelectric conversion device PD2, i.e., an upper photoelectric conversion device of the stacked photoelectric conversion devices PD1 and PD2, may be an organic photoelectric conversion device that does not include a transfer gate electrode. Accordingly, a decrease of an area of the light-receiving surface of the first photoelectric conversion device PD1, i.e., a lower photoelectric conversion device of the stacked photoelectric conversion devices PD1 and PD2, which may result from the presence of a transfer gate electrode, may be prevented.

Additionally, the first photoelectric conversion device PD1, i.e., a lower photoelectric conversion device of the stacked photoelectric conversion devices PD1 and PD2, may include a transfer gate electrode TG extending in a direction perpendicular to a light-receiving surface of the second photoelectric conversion device PD2, so as not to reduce the light-receiving surface of the second photoelectric conversion device PD2. Since the first photoelectric conversion device PD1 includes the transfer transistor TX, the first photoelectric conversion device PD1 may be controlled greatly, and a large area or a great fill factor with respect to a light-receiving surface of the first photoelectric conversion device PD1 may be obtained.

Accordingly, since the pixel 100 that includes the stacked photoelectric conversion devices PD1 and PD2 having a large light-receiving surface may have a high degree of integration of a pixel, and light may be accurately detected, performance of the image sensor may improve. A detailed structure of a pixel will be described with reference to FIGS. 2 and 3.

Figure 2:
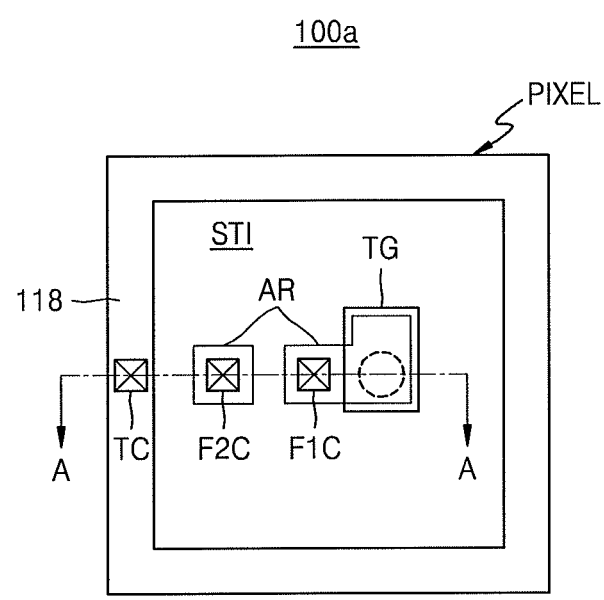
FIG. 2 illustrates a layout of a pixel included in an image sensor according to embodiments.
Figure 3:
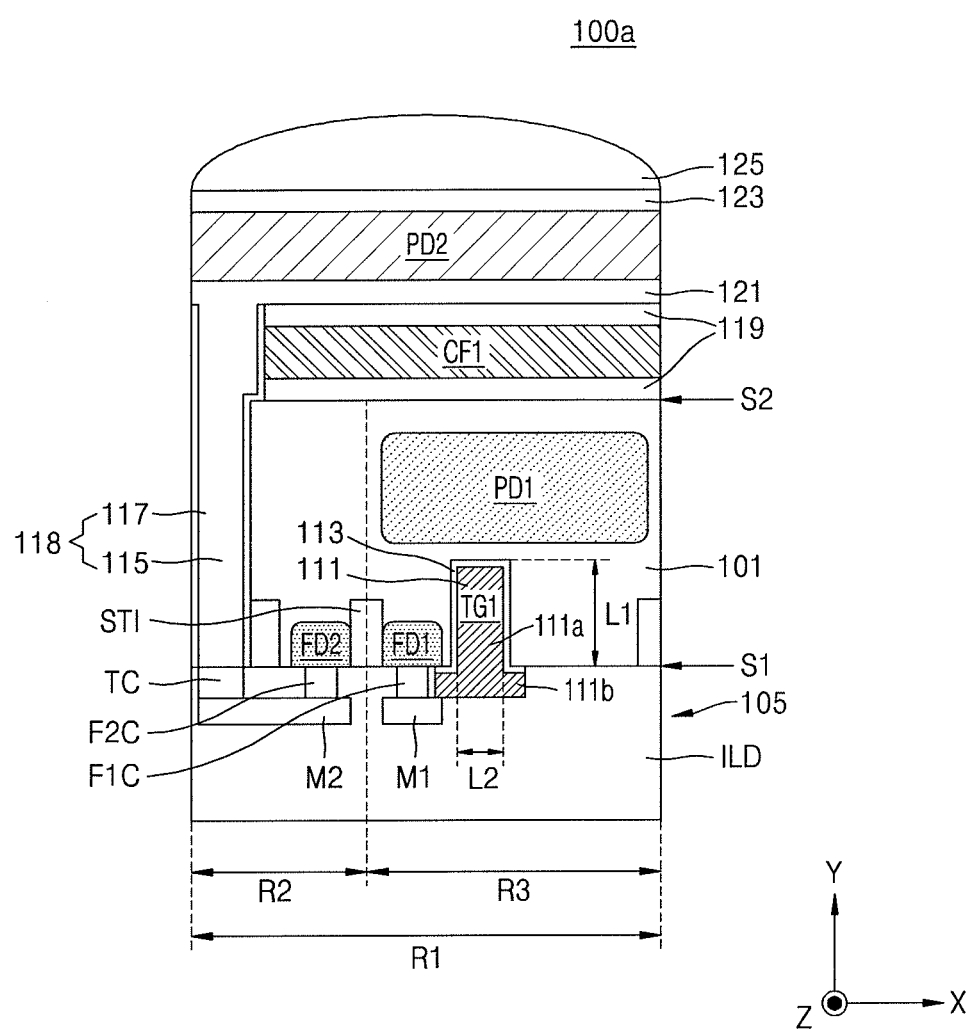
FIG. 3 illustrates a cross-sectional view taken along a line A-A of FIG. 2 and showing a pixel 100a included in the image sensor, according to embodiments.

FIG. 2 illustrates a layout of a pixel 100a included in an image sensor according to embodiments. FIG. 3 is a cross-sectional view taken along a line A-A shown in FIG. 2 and showing the pixel 100a included in the image sensor, according to embodiments.

Referring to FIGS. 2 and 3, the pixel 100a may include a substrate 101 that includes a first surface S1 and a second surface S2, which faces the first surface S1 and on which light is incident, the semiconductor photoelectric conversion device PD1 in the substrate 101, a transfer gate electrode TG1, a color filter layer CF1 on the second surface S2 of the substrate 101, an organic photoelectric conversion device PD2 stacked on the color filter layer CF1, a pixel circuit layer 105 on the first surface S1 of the substrate 101, and a micro lens layer 125 on the organic photoelectric conversion device PD2. The transfer gate electrode TG1 is between the first surface S1 and the semiconductor photoelectric conversion device PD1 in the substrate 101 and extends in a first direction (a Y direction) perpendicular to the first surface S1.

In detail, the substrate 101 may be a semiconductor wafer substrate formed of silicon or the like, a bulk substrate, an epitaxial substrate, a silicon-on-insulator (SOI) substrate, or the like. The substrate 101 may include the first surface S1 and the second surface S2 which face each other, i.e., are separated along a first direction (a Y direction), and light may be incident on the second surface S2. Additionally, the substrate 101, the first surface S1, and the second surface S2 may extend in a second direction (an X direction) and/or a third direction (a Z direction).

The semiconductor photoelectric conversion device PD1 may be formed on the substrate 101. The substrate 101 may be a semiconductor substrate doped with P-type impurities, and the semiconductor photoelectric conversion device PD1 may be doped with a type of impurity different from an impurity doped in the substrate 101, for example, an N-type impurity. In other words, the semiconductor photoelectric conversion device PD1 may be a photo diode.

According to embodiments, if the semiconductor photoelectric conversion device PD1 is formed by doping an N-type impurity in a P-type substrate 101, the semiconductor conversion device PD1 may gather an electron from an electron-hole pair generated from light incident thereon. According to other embodiments, if the semiconductor photoelectric conversion device PD2 is formed by doping a P-type impurity in an N-type substrate 101, the semiconductor photoelectric conversion device PD1 may gather a hole from an electron-hole pair generated from light incident thereon.

The semiconductor photoelectric conversion device PD1 may absorb light incident on the semiconductor photoelectric conversion device PD1 via the micro lens layer 125 and the color filter layer CF1, and generate a photocurrent. A path via which electric charges accumulated in the semiconductor photoelectric conversion device PD1 move may be opened or closed by a transfer transistor including the transfer gate electrode TG1. If the path via which the electric charges move between the semiconductor photoelectric conversion device PD1 and the outside is closed by the transfer gate electrode TG1, an amount of electronic charges accumulated in the semiconductor photoelectric conversion device PD1 may increase with a strength of light absorbed by the semiconductor photoelectric conversion device PD1. Then, if the path via which the electric charges move between the semiconductor photoelectric conversion device PD1 and the outside is opened by the transfer transistor that includes the transfer gate electrode TG1, a strength of absorbed light may be detected by an external circuit that received an amount of the electric charges accumulated in the semiconductor photoelectric conversion device PD1.

The transfer gate electrode TG1 may be located between the first surface S1 and the semiconductor photoelectric conversion device PD1 on the substrate 101 and extend toward the first direction (the Y direction) perpendicular to the first surface S1. The transfer gate electrode TG1 may extend from the first surface S1 of the substrate 101 to the inside of the substrate 101 in the first direction (the Y direction). Accordingly, the transfer gate electrode TG1 may overlap a light-receiving surface of the semiconductor photoelectric device PD1 in a direction perpendicular to a direction in which a light-receiving surface of the semiconductor photoelectric device PD1 extends (the X direction or the Z direction).

A first length L1 by which the transfer gate electrode TG1 in the substrate 101 extends in the first direction (the Y direction) may be greater than a second length L2 by which the transfer gate electrode TG1 extends in the second or third direction (the X direction or the Z direction). Outer surfaces of the transfer gate electrode TG1 in the substrate 101 may be covered by a gate dielectric layer 113.

Generally, the transfer gate electrode TG1 may be formed to be identical to and parallel with a direction (the X direction or the Z direction) in which a light-receiving surface of the semiconductor photoelectric conversion device PD1 extends. In this case, it may be difficult to obtain an area of the light-receiving surface of the semiconductor photoelectric conversion device PD1.

However, according to an embodiment, the transfer gate electrode TG1 included in the pixel 100a may be formed in a direction perpendicular to a direction in which the light-receiving surface of the semiconductor photoelectric conversion device PD1 extends. Accordingly, since the transfer gate electrode TG1 does not cover an area along a direction in which the light-receiving surface of the semiconductor photoelectric conversion device PD1 extends, the light-receiving surface of the semiconductor photoelectric conversion device PD1 may be large. As may be seen in FIGS. 2 and 3, a largest dimension of the semiconductor photoelectric conversion device PD1 may be along a second direction (a X direction), while that of the transfer gate electrode TG1 may be along a first direction (a Y direction), e.g., a direction the separates the first and second surfaces of the substrate 101.

The transfer gate electrode TG1 may include a depressing part 111a extending from the first surface S1 of the substrate 101 to the inside of the substrate 101 along a first direction (a Y direction) and a protruding part 111b protruding from the first surface S1. The protruding part of the transfer gate electrode TG1 may be formed to be surrounded by the pixel circuit layer 105 on the first surface S1 of the substrate 101, and may extend further along a second direction (a X direction) than the depressing part 111a. The gate dielectric layer 113 may be between the outer edges of the protruding part 111b and the first surface S1 of the substrate 101.

The first floating diffusion FD1 may be formed on the first surface S1 of the substrate 101 to be adjacent and electrically connected to the transfer gate electrode TG1. The first floating diffusion FD1 may overlap the semiconductor photoelectric conversion device PD1 in the first direction (the Y direction). The first floating diffusion FD1 corresponds to an area that receives accumulated electric charges from the semiconductor photoelectric charges PD1, and a path via which electric charges moves may be obtained by applying a gate voltage to the transfer gate electrode TG1. As described above, since the transfer gate electrode TG1 is formed in a direction perpendicular to the first surface S1 of the substrate 101 and a light-receiving surface of the semiconductor photoelectric conversion device PD1, the path via which the electric charges move may be formed in a direction perpendicular to the light-receiving surface of the semiconductor photoelectric conversion device PD1.

An insulating layer 119 may be formed on the second surface S2 of the substrate 101. The insulating layer 119 may be formed by using silicon oxide (SiOx), silicon oxynitride (SiOxNy), silicon nitride (SiNx), germanium oxynitride (GeOxNy), germanium silicon oxide (GeSixOy), or a material having a high permittivity.

The color filter layer CF1 may be formed inside the insulating layer 119, e.g., the insulating layer may above and below the color filter layer CF1. Only light in a particular wavelength band from among light incident on the color filter layer CF1 may pass through the color filter layer CF1. For example, one from among green light, red light, and blue light may pass through the color filter layer CF1. The semiconductor photoelectric conversion device PD1 arranged below the color filter layer CF1 may detect light in a particular wavelength band which has passed through the color filter layer CF1, and generate an electric signal. The color filter layer CF1 may fully overlap the semiconductor photoelectric conversion device PD1 in the first direction (a Y direction), but may only partially overlap the organic photoelectric conversion device PD2.

In detail, the organic photoelectric conversion device PD2 may convert light in a first wavelength band from light incident on the organic photoelectric conversion device PD2, e.g., green light, into an electric signal. The color filter layer CF1 may transmit light in a second wavelength band from among the incident light, which is not converted into an electric signal by the organic photoelectric conversion device PD2, e.g., red light. The semiconductor photoelectric conversion device PD1 may convert the light in the second wavelength, e.g., the red light, into an electric signal. In other words, compared to case wherein a plane-type photoelectric conversion device detects a color component in an area having same size as the area of the stacked photoelectric conversion devices PD1 and PD2, the stacked photoelectric conversion devices PD1 and PD2 according to an embodiment may detect a plurality of color components in an area. A detailed description thereof will be described later with reference to FIG. 4.

The organic photoelectric conversion device PD2 may be stacked on the insulating layer 119. The organic photoelectric conversion device PD2 may be formed of a non-silicon (non-Si) material such as an organic semiconductor, a quantum dot, chalcogenide, or the like, an amorphous silicon (a-Si) material, and so forth.

A first electrode 121 and a second electrode 123 may be above and below the organic photoelectric conversion device PD2. The first electrode 121 may be formed on the insulating layer 119, the organic photoelectric conversion device PD2 may be formed on the first electrode 121, and the second electrode 123 may be formed on the organic photoelectric conversion device PD2. A first voltage may be applied to the first electrode 121, and a second voltage may be applied to the second electrode 123.

According to one or more embodiments, if a level of the first voltage is greater than a level of the second voltage, for example, if the first voltage is a positive voltage and the second voltage is a negative voltage, the organic photoelectric conversion device PD2 may gather an electron from an electron-hole pair generated when light is incident thereon. According to another embodiment, if a level of the first voltage is less than a level of the second voltage, for example, if the first voltage is a negative voltage and the second voltage is a positive voltage, the organic photoelectric conversion device PD2 may gather a hole from an electron-hole pair generated when light is incident thereon. In other words, one of the first and second electrodes 121 and 123 may be configured to receive the control voltage Vvs shown in FIG. 1.

The micro lens layer 125 may be formed on the first electrode 121, the organic photoelectric conversion device PD2, and the second electrode 123. The micro lens layer 125 may adjust a path of light so that light incident on the pixel 100a concentrates on the organic photoelectric conversion device PD2 and the semiconductor photoelectric conversion device PD1.

The organic photoelectric conversion device PD2 may be connected to the pixel circuit layer 105 on the first surface S1 of the substrate 101 by using a through wiring 115 that passes through the substrate 101 and the insulating layer 119.

The second floating diffusion FD2 may be formed on the first surface S1 of the substrate 101 to be adjacent and electrically connected to the through wiring 115. The through wiring 115 may be electrically connected to the second floating diffusion FD2 by using contacts TC and F2C and a wiring M2 on the pixel circuit layer 105. The second floating diffusion FD2 and the semiconductor photoelectric conversion device PD1 may not overlap each other in the first direction (the Y direction). The first and second floating diffusions FD1 and FD2 may be electrically separated from each other by a device separating layer STI. The through wiring 115 may be made of the same material as the first electrode 121.

Figure 4:
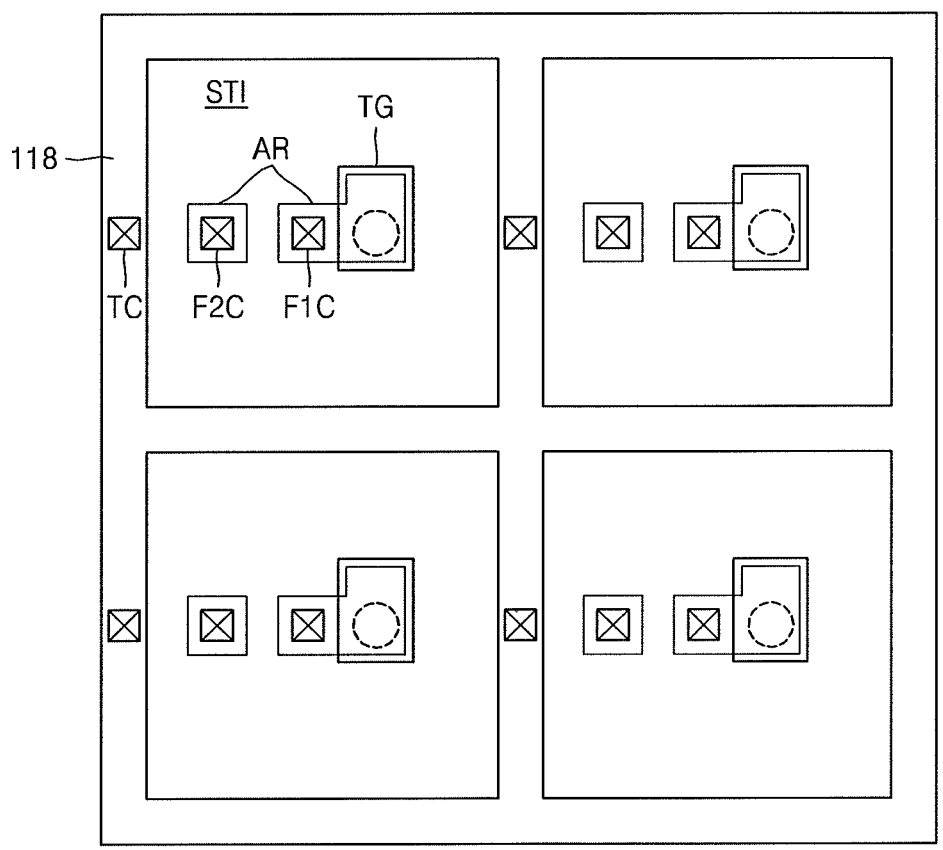
FIG. 4 illustrates a layout of an array of pixels included in an image sensor according to embodiments.

The through wiring 115 may be surrounded by the insulating layer 117 to be insulated from the substrate 101. The through wiring 115 and the insulating layer 115 may constitute the pixel separator 118 separating a plurality of pixel areas arranged on the substrate 101 from each other. The pixel separator 118 may have a deep trench isolation (DTI) structure formed from the first surface S1 to the second surface S2 of the substrate 101. The through wiring 115 may be connected to the first electrode 121 below the organic photoelectric conversion device PD2. A pixel area R1 may be defined on the substrate 101 by using the pixel separator 118. Referring to FIG. 4, the pixel separator 118 may have a plane net structure.

The through wiring 115 may be formed of a conductive material to transmit a photoelectric conversion signal from the organic photoelectric conversion device PD2 to the pixel circuit layer 105. For example, the through wiring 115 may be formed by combining tungsten, aluminum, copper, doped silicon, or silicon doped with metal with each other. The insulating layer 117 covering the through wiring 115 may be formed of an insulating material to be electrically insulated from the substrate 101. The insulating layer 117 may extend in the first direction (a Y direction) along the color filter layer CF1.

The pixel circuit layer 105 may be formed on the first surface S1 of the substrate 101. A part of the transfer gate electrode TG1 on the substrate 101 may be formed on the pixel circuit layer 105. Additionally, the pixel circuit layer 105 may be electrically connected to the organic photoelectric conversion device PD2 via the through wiring 115 that is formed to pass through the substrate 101.

The pixel circuit layer 105 may include a transistor or wirings that may control the organic photoelectric conversion device PD2 and the semiconductor photoelectric conversion device PD1. In other words, the pixel circuit layer 105 may include the contact F1C connected to the first floating diffusion FD1, and wirings M1 connected to the contact F1C. Additionally, the circuit pixel layer 105 may include the contact F2C connected to the second floating diffusion FD2, the contact TC connected to the through wiring 115, and the wiring M2. As described above with reference FIG. 1, the pixel circuit layer 105 may include a part of the transfer transistor TX, the first reset transistor RX1, the first source follower transistor SX1, the first selection transistor AX1, or the like which drive the semiconductor photoelectric conversion device PD1. Additionally, the pixel circuit layer 105 may include the second reset transistor RX2, the second source-follower transistor SX2, the second selection transistor AX2, or the like which drive the organic photoelectric conversion device PD2.

As such, the pixel area R1 of the pixel 100a may include the photoelectric conversion devices PD1 and PD2 stacked on each other. The substrate 101 may be divided into a first area R2 and a second area R3, and structures for electrically connecting the organic photoelectric conversion device PD2 to the pixel circuit layer 105 are arranged in the first area R2, and structure for driving the semiconductor photoelectric conversion device PD1 arranged on a lower layer from among the layers of the stacked photoelectric conversion devices PD1 and PD2 are arranged in the second area R3. The semiconductor photoelectric device PD1 arranged on the lower layer may have a reduced light-receiving surface due to the second area R2.

However, according to embodiments, the organic conversion device PD2 on the upper layer may not include a transfer gate electrode. Accordingly, the first area R2 may be small compared to the second area R3, and the second area R3 may be large compared to the second area R3. In other words, an area of the light-receiving surface of the semiconductor photoelectric conversion device PD1, i.e., a lower layer photoelectric conversion device of the stacked photoelectric conversion devices PD1 and PD2, may be increased.

Additionally, the semiconductor photoelectric conversion device PD1 on a lower layer from among the layers of the stacked photoelectric conversion devices PD1 and PD2 may include the transfer gate electrode TG1 extending in a direction perpendicular to a light-receiving surface. Since the semiconductor photoelectric conversion device PD1 includes the transfer gate electrode TG1 that extends in a different direction than the semiconductor photoelectric conversion device PD1, the semiconductor photoelectric conversion device PD1 may be controlled, and a light-receiving surface of the semiconductor photoelectric conversion device PD1 may be increased.

Accordingly, since a pixel that includes the stacked photoelectric conversion devices PD1 and PD2 having a large light-receiving surface may accurately detect light, performance of an image sensor may improve.

FIG. 4 is a layout of an array 1000 of pixels included in an image pixel according to embodiments. Referring to FIGS. 2 through 4, the pixel area R1 may be defined by using the pixel separator 118. The pixel separator 118 may have a plan net structure.

Figure 5A:
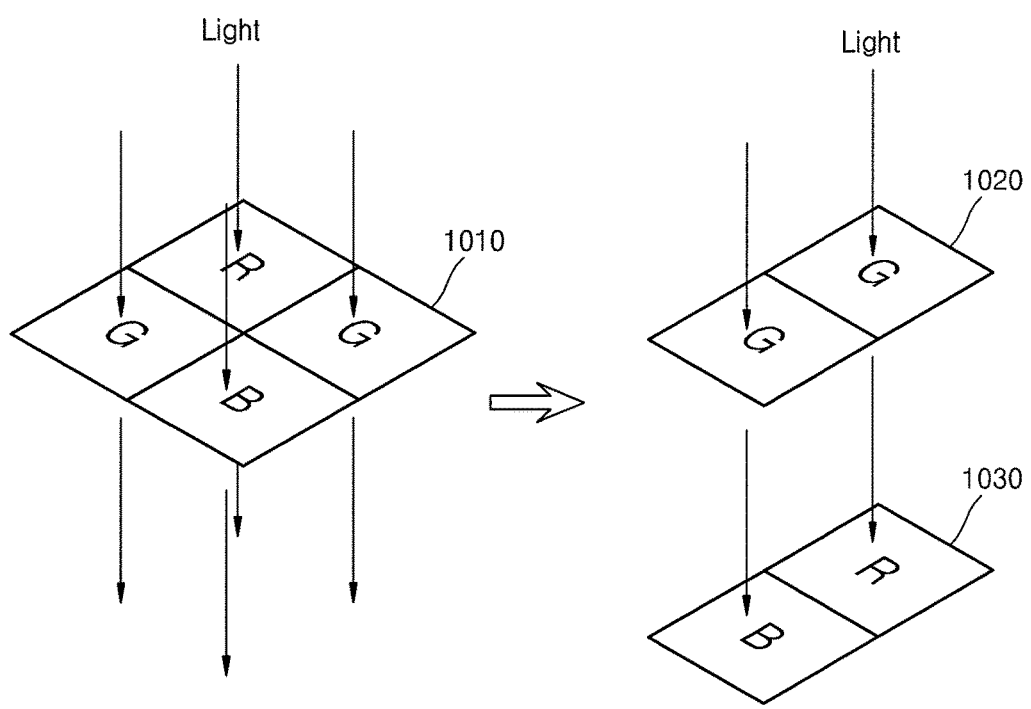
FIGS. 5A and 5B illustrate an effect of a stacked photoelectric conversion device according to embodiment.
Figure 5B:
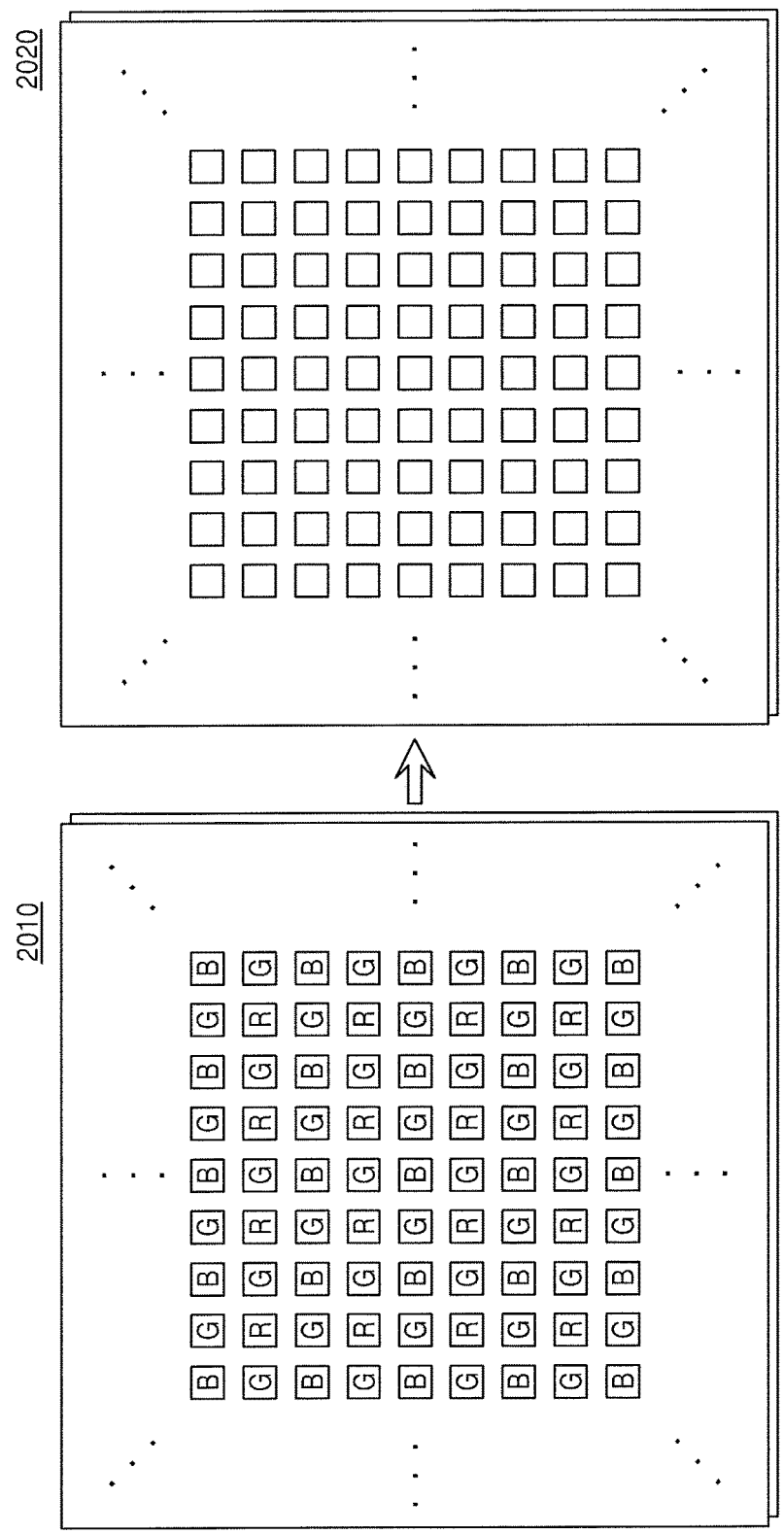

FIGS. 5A and 5B illustrate an effect of a stacked photoelectric conversion device according to embodiments. A left side of FIG. 5A shows a general plane-type photoelectric conversion device. A right side of FIG. 5A shows a stacked photoelectric conversion device.

Referring to the left side of FIG. 5A, a color filter layer 1010 may include a plurality of color filter layers having a Bayer pattern, e.g., a red filter layer, two green filter layers, and a blue filter layer. The Bayer pattern is a pattern having 50% green filter, 25% red filter, and the remaining 25% blue filter. As shown in the left side of FIG. 5A, four color filter layers adjacent to each other and configured to form a quadrangle may include two green filter layers G, one red filter layer R, and one blue filter layer B.

The green filter layer G, the red filter layer R, and the blue filter layer B included in the color filter layer 1010 may respectively transmit only a green component, a red component, and a blue component from among light incident on the color filter layer 1010. Additionally, each pixel may detect only one color component. Only one color component is incident on a photoelectric conversion device arranged below the color filter layer 1010, and the photoelectric conversion device converts the color component into an electrical signal. Then, an image may be formed by interpolating color components, respectively detected from photoelectric conversion devices adjacent to each other. In other words, a green filter layer, a red filter layer, a blue filter layer, and at least four photoelectric conversion devices arranged in a plane structure below each filter layer need to form a pixel so that a pixel accurately detects a color of light.

In contrast, referring to the right drawing, a first photoelectric conversion device 1020 for converting a green component of light into an electrical signal, for example, an organic photoelectric conversion device may be stacked on a red and blue filter layer 1030. A green component of light passing through the first photoelectric conversion device 1020 may be converted into an electrical signal by the first photoelectric conversion device 1020. Additionally, other color components of the light, other than the green component, pass through the red and blue filter layer 1030 without being converted into an electrical signal. Light having a red component and a blue component is incident on a second photoelectric conversion device arranged below the red and blue filter layer 1030. The second photoelectric conversion device may respectively convert the red component and the blue component into an electrical signal. As such, since a pixel that includes a stacked photoelectric conversion device is formed of four photoelectric conversion devices stacked with each other, an area of the pixel may be smaller than an area of a pixel that includes a plane-type photoelectric conversion device. Accordingly, an area of a pixel may decrease, and a clear image may be obtained by reducing a degree of interpolation between color components of photoelectric conversion devices adjacent to each other.

An example in which the first photoelectric conversion device 1020 converts a green component of light into an electrical signal and the red and blue filter layer 1030 is arranged below the first photoelectric conversion device 1020 is described with reference to FIG. 5. However, embodiments are not limited thereto. The organic photoelectric conversion device 1020 may convert a color component, other than a green component, into an electrical signal, and the red and blue color filter layer 1030 may be a color filter layer of another color component.

Referring to FIG. 5B, a first pixel array 2010 may have a structure in which a photoelectric conversion device is arranged in a pixel, and a Bayer pattern is arranged in the photoelectric conversion device. Accordingly, in the first pixel array 2010, only one color component of light may be converted into an electrical signal with respect to a pixel.

On the contrary, the second pixel array 2020 may have a structure in which a first photoelectric conversion device and a second photoelectric conversion device are stacked with each other in one pixel. Accordingly, in the second pixel array 2020, a plurality of color components may be converted into an electrical signal with respect to a pixel.

Figure 6:
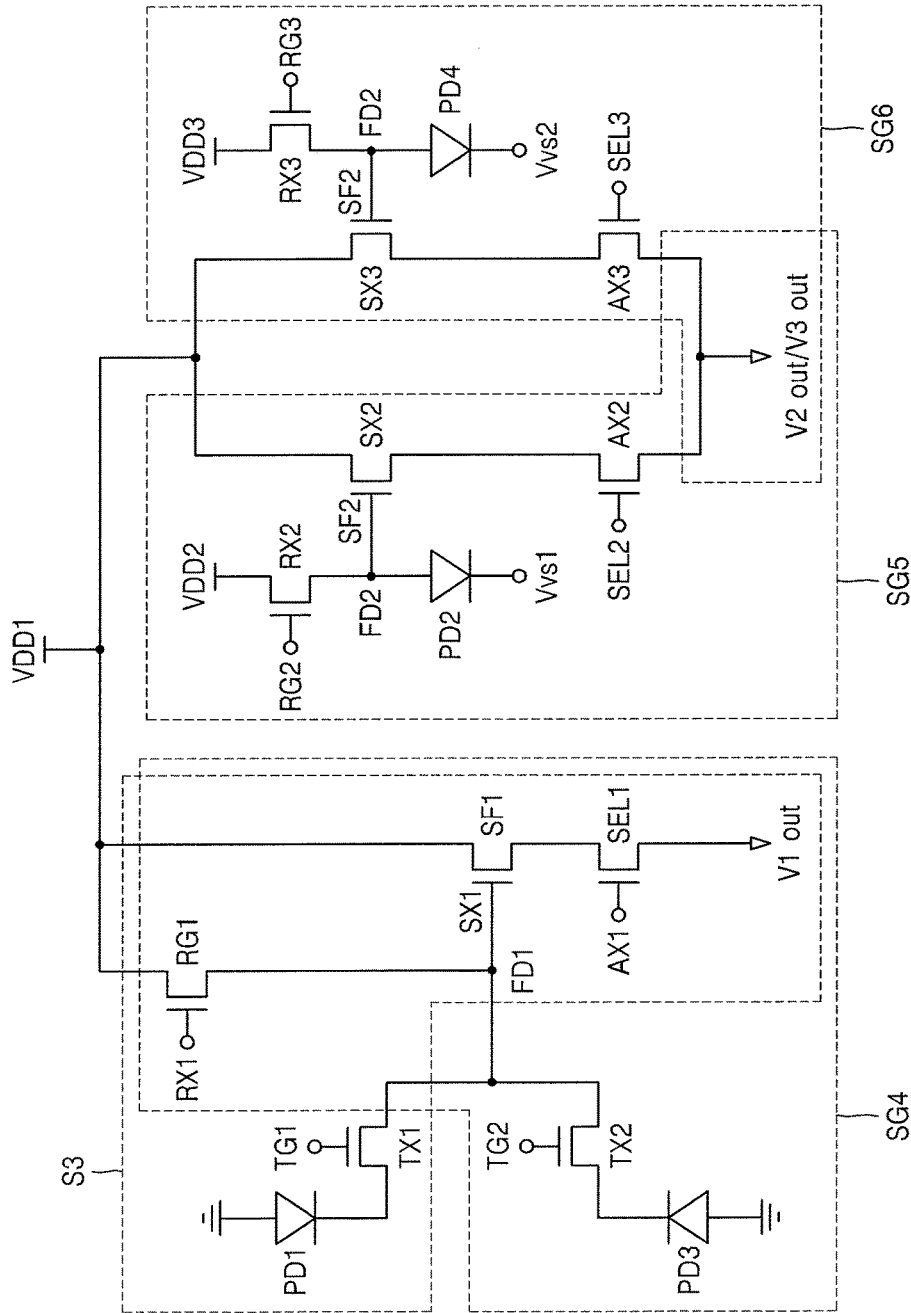
FIG. 6 illustrates a circuit diagram of a pixel included in an image sensor according to embodiments.

FIG. 6 illustrates a circuit diagram of a pixel 200 included in an image sensor according to embodiments. The pixel 200 shown in FIG. 6 is similar to the pixel 100 shown in FIG. 1. However, since the semiconductor photoelectric conversion devices PD1 and PD3 respectively formed in pixel areas R4 and R5 share the first floating diffusion FD1, and the pixel 200 includes the first and second color filter layers CF1 and CF2 that respectively transmit color components different from each other, the pixel 200 may detect all colors of light incident thereon, e.g., visible light.

Referring to FIG. 6, the pixel 100 may include first through fourth photoelectric signal generators SG3 through SG5. The first and second photoelectric signal generator SG3 and SG4 may have a 4T structure that includes the transfer transistors TX1 and TX2 which are respectively electrically connected to the first and third photoelectric conversion devices PD1 and PD3. The third and fourth photoelectric signal generators SG5 and SG6 may have a 3T structure that does not include transfer transistors respectively connected to the second and fourth photoelectric conversion devices PD2 and PD4.

The first and second photoelectric signal generator SG3 and SG4 may respectively include the first and third photoelectric conversion devices PD1 and PD3. The first and third photoelectric conversion devices PD1 and PD3 may respective detect light having wavelengths different from each other. Additionally, the first and second photoelectric signal generators SG3 and SG4 may respectively include the first and second transfer transistors TX1 and TX2. A drain of each of the first and second transfer transistors TX1 and TX2 may be the first floating diffusion FD1. In this case, the first and second photoelectric signal generators SG3 and SG4 may share the first source follower transistor SX1, the first reset transistor RX1, and the first selection transistor AX1 via the first floating diffusion FD1.

The first and second transfer transistors TX1 and TX2 may connect or disconnect the first and third photoelectric conversion devices PD1 and PD3 to or from the first floating diffusion FD1 according to voltages of the first and second transfer gates TG1 and TG2.

Light incident on the first and third photoelectric conversion devices PD1 and PD3 may be accumulated in the first and third conversion devices PD1 and PD3 as electric charges. If the electric charges accumulated in the first and third photoelectric conversion devices PD1 and PD3 are transmitted to the first floating diffusion FD1, the electric charges may be output to the outside via the first source follower transistor SX1 and the first selection transistor AX1. In other words, a first analog voltage V1out corresponding to a voltage change in the first floating diffusion FD1 may be transmitted to an external lead circuit. A detailed description thereof is described above with reference to FIG. 1.

The third and fourth photoelectric signal generators SG5 and SG6 may respectively include the second and fourth photoelectric conversion devices PD2 and PD4. The second and fourth photoelectric conversion devices PD2 and PD4 may detect light having wavelengths identical to each other. Additionally, both the third and fourth photoelectric signal generators SG5 and SG6 may not include a transfer transistor. The third and fourth photoelectric signal generators SG5 and SG6 may respectively include source follower transistors SX2 and SX3, reset transistors RX2 and RX3, and selection transistors AX2 and AX3.

The third and fourth photoelectric signal generators SG5 and SG6 may be different from the first and second photoelectric signal generators SG3 and SG4 in that the third and fourth photoelectric signal generators SG5 and SG6 do not include a transfer transistor. The second and fourth photoelectric conversion devices PD2 and PD4, respectively included in the third and fourth signal generators SG5 and SG6, may be organic photoelectric conversion devices.

The second and fourth photoelectric conversion devices PD2 and PD4 may be respectively connected to sources of first and second control voltages Vvs1 and Vvs2 so that a voltage bias may be separately applied to the second and fourth photoelectric conversion devices PD2 and PD4. Additionally, the second and fourth photoelectric conversion devices PD2 and PD4 may be respectively connected to the second and third floating diffusions FD2 and FD3. The second floating diffusion FD2 may be a source of the second reset transistor RX2. The second floating diffusion FD2 may be electrically connected to a second source follower gate SF2 of the second source follower transistor SX2. The second source follower transistor SX2 is connected to the second selection transistor AX2. Likewise, the third flowing diffusion FD3 may be a source of the third reset transistor RX3. The third floating diffusion FD3 may be electrically connected to a third source follower gate SF3 of the third source follower transistor SX3. The third source follower transistor SX3 is connected to the third selection transistor AX3.

Second and third power voltages VDD2 and VDD3 may be respectively applied to drains of the second and third reset transistors RX2 and RX3, and a first power voltage VDD1 may be applied to drains of the second and third source follower transistors SX2.

If light is incident on the second and fourth photoelectric conversion devices PD2 and PD4, electric charges may be respectively accumulated in second and fourth photoelectric conversion devices PD2 and PD4. If the electric charges accumulated in the second and fourth photoelectric conversion devices PD2 and PD4 are transmitted to the second and third floating diffusions FD2 and FD3, the electric charges may be output to the outside respectively via the third and fourth source follower transistors SX2 and SX3 and the second and third selection transistors AX2 and AX3. In other words, second and third analog voltages V2out and V3out corresponding to a voltage change in the second and third floating diffusions FD2 and FD3 may be transmitted to an external lead circuit.

The pixel 200 may include a stacked photoelectric conversion device that includes the first and second photoelectric conversion devices PD1 and PD2 for detecting light having wavelengths different from each other, and a stacked photoelectric conversion device that includes the third and fourth photoelectric conversion devices PD3 and PD4 which are adjacent to the first and second photoelectric devices PD1 and PD2, respectively. If the first through fourth photoelectric devices PD1 through PD4 respectively detect a green component, a red component, and a blue component of light, the pixel 100 having a small area may be provided. Accordingly, since the image sensor may accurately detect light having various wavelengths with a high resolution, performance of the image sensor may improve.

However, an area of a light-receiving surface of the photoelectric conversion devices PD1 through PD4 may be reduced due to wirings connected to each of the photoelectric conversion devices PD1 through PD4. Particularly, an area of a light-receiving surface of a first photoelectric conversion device, formed on a lower layer from among layers of the stacked photoelectric conversion devices PD1 through PD4, may be reduced.

According to embodiments, in the pixel 200, the second and fourth photoelectric conversion devices PD2 and PD4, formed on upper layers from among layers of the stacked photoelectric conversion devices PD1 through PD4, may be organic photoelectric conversion devices that do not include a transfer gate electrode. Accordingly, a decrease of an area of the light-receiving surface of the first and third photoelectric conversion devices PD1 and PD3 formed on lower layers from among the layers of the stacked photoelectric conversion devices PD1 through PD4, which may be caused by forming of the transfer gate electrode, may be prevented.

Additionally, the first and third photoelectric conversion device PD1 and PD3, formed on lower layers from among the layers of the stacked photoelectric conversion devices PD1 through PD4, may include the first and second transfer gate electrode TG1 and TG2 extending in a direction perpendicular to a light-receiving surface of the third photoelectric conversion device PD3 so as not to reduce the light-receiving surface of the third photoelectric conversion device PD3. Since the pixel 200 includes the first and second transfer transistor TX1 and TX2, the first and third photoelectric conversion device PD1 and PD3 may be respectively controlled, and a large area or a great fill factor with respect to a light-receiving surface of the first and third photoelectric conversion devices PD1 and PD3 may be ensured. A detailed description thereof will be described with reference to FIGS. 7 and 8.

Figure 7:
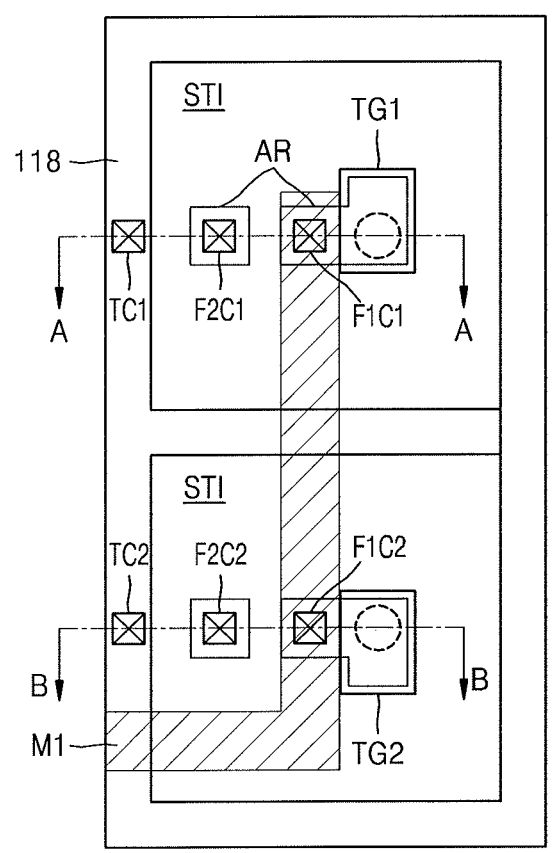
FIG. 7 illustrates a circuit diagram of a pixel included in an image sensor according to embodiments.
Figure 8:
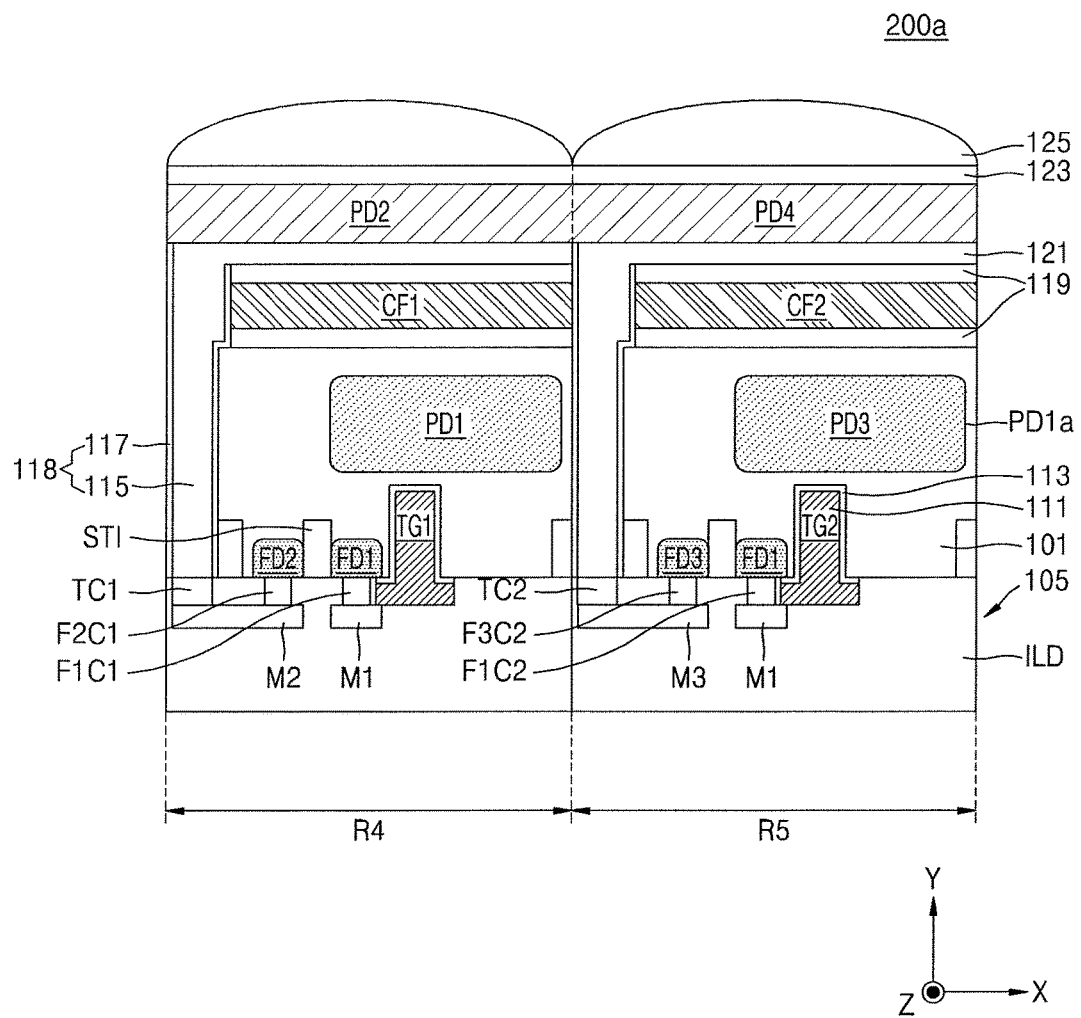
FIG. 8 illustrates a cross-sectional view taken along a line A-A and a line B-B of FIG. 7 and showing a pixel included in an image sensor, according to embodiments.

FIG. 7 illustrates a circuit diagram of a pixel 200a included in an image sensor according to embodiments. FIG. 8 is a cross-sectional view taken along a line A-A and a line B-B of FIG. 7 and showing the pixel 200a included in the image sensor, according to embodiments.

Referring to FIGS. 7 and 8, the pixel 200a may include the substrate 101 that includes the first surface and the second surface that faces the first surface and on which light is incident, the first and second semiconductor photoelectric conversion devices (first and third photoelectric conversion devices) PD1 and PD3 respectively arranged on two pixel areas R4 and R5 in the substrate 101, the first and transfer gate electrodes TG1 and TG2 located between the first surface and the first and second semiconductor photoelectric conversion devices PD1 and PD2 in the two pixel areas R4 and R5 and extending in a first direction (a Y direction) perpendicular to the first surface, first and second color filter layers CF1 and CF2 on the second surface of the two pixel areas R4 and R5, first and second organic photoelectric conversion devices (second and fourth photoelectric conversion devices) PD2 and PD4 stacked on the first and second color filter layers CF1 and CF2, the pixel circuit layer 105 on the first surface S1 of the substrate 101, and the micro lens layer 125 on the first and second organic photoelectric conversion devices PD3 and PD4.

The substrate 101, the first surface S1, and the second surface S2 may extend in a second direction (an X direction) or a third direction (a Z direction). The substrate 101 may be a semiconductor substrate doped with P-type impurities, and the first and second semiconductor photoelectric conversion devices PD1 and PD3 may be doped with a type of impurity different from an impurity doped in the substrate 101, for example, an N-type impurity. The first and second semiconductor photoelectric conversion devices PD1 and PD3 may include impurities different from each other.

The first and second semiconductor photoelectric conversion devices PD1 and PD3 may absorb light which is respectively incident on the first and second semiconductor photoelectric conversion devices PD1 and PD3 via the micro lens layer 125 and the first and second color filter layers CF1 and CF2, and generate a photocurrent. The first and second color filter layers CF1 and CF2 may transmit light in wavelength bands different from each other, from among the incident light.

The first and second transfer gate electrodes TG1 and TG2 may be located between the first surface S1 and the first and second semiconductor photoelectric conversion devices PD1 and PD2 in the substrate 101, and extend in the first direction (the Y direction) perpendicular to the first surface S1.

Accordingly, since the first and second transfer gate electrodes TG1 and TG2 do not cover an area along a direction in which light-receiving surfaces of the semiconductor photoelectric conversion devices PD1 and PD3 extend, an area of the light-receiving surfaces of the first and second semiconductor photoelectric conversion devices PD1 and PD3 may be large.

The first floating diffusions FD1 may be formed on the first surface of the substrate 101 to be respectively adjacent and electrically connected to the first and second transfer gate electrodes TG1 and TG2. The first floating diffusions FD1 may correspond to an area for receiving accumulated electric charges from the semiconductor photoelectric device PD1. The first floating diffusions FD1 respectively formed on the two pixel areas R4 and R5 may be electrically shared between the first and second semiconductor photoelectric devices PD1 and PD3 via contacts F1C1 and F1C2 and the first wiring M1 respectively connected to the first floating diffusions FD1.

The insulating layer 119 may be formed on the second surface S2 of the substrate 101. The first and second color filter layers CF1 and CF2 may be formed inside the insulating layer 119. The color filter layers CF1 and CF2 may transmit only light in a particular wavelength band from among light incident on the first and second color filter layers CF1 and CF2. The first and second color filter layers CF1 and CF2 may be selected to transmit light in wavelength bands different from each other. The first and second semiconductor photoelectric conversion devices PD1 and PD3 respectively arranged below the first and second color filter layers CF1 and CF2 may detect light in a particular wavelength that passed through the first and second color filter layers CF1 and CF2, and generate an electric signal.

The first and second organic photoelectric conversion devices PD2 and PD4 may be stacked on the insulating layer 119. The first electrode 121 and the second electrode 123 may be formed above and below the first and second organic photoelectric conversion device PD2 and PD4.

The first color filter layer CF1 and the first organic photoelectric conversion device PD2 may be arranged on the first semiconductor photoelectric conversion device PD1. The second color filter layer CF2 and the second organic photoelectric conversion device PD4 may be arranged on the second semiconductor photoelectric conversion device PD3.

According to one or more embodiments, the first and second organic photoelectric conversion devices PD2 and PD4 may convert green light into an electric signal. The first and second color filter layers CF1 and CF2 may transmit light in a wavelength band which is not converted into an electric signal by the first and second organic photoelectric conversion devices PD2 and PD4, from among light incident on the first and second color filter layers CF1 and CF2. For example, if the first color filter layer CF1 transmits red light, the first semiconductor photoelectric conversion device PD1 may detect a strength or intensity of red light, and generate an electrical signal. If the second color filter layer CF2 transmits blue light, the second semiconductor photoelectric conversion device PD3 may detect a strength or intensity of blue light, and generate an electrical signal. In other words, since a plurality of the stacked photoelectric conversion devices PD1 through PD4 may accurately detect all color in a small area compared to a plane-type photoelectric conversion device, a degree of integration of the image sensor may increase.

The first and second organic photoelectric conversion devices PD2 and PD4 may be connected to the pixel circuit layer 105 on the first surface S1 of the substrate 101 by using through wirings 115 that pass through the substrate 101 and the insulating layer 119.

The second and third floating diffusions FD2 and FD3 may be respectively formed in the two pixel areas R4 and R4 of the first surface S1 of the substrate 101. The second and third floating diffusions FD2 and FD3 may be respectively electrically connected to the through electrodes 115 respectively formed on the two pixel areas R4 and R5.

The through electrodes 115 may be respectively electrically connected to the second and third floating diffusions FD2 and FD3 via contacts TC1, F2C1, TC2, and F2C2 and the wirings M2 on the pixel circuit layer 105. However, the second and third floating diffusions FD2 and FD3 may not be electrically connected to each other. The through wirings 115 may be surrounded by the insulating layer 117. Additionally, the through wirings 115 and the insulating layer 117 may constitute the pixel separator 118 for separating a plurality of pixel areas arranged on the substrate 101 from each other.

The pixel circuit layer 105 may include a transistor or wirings that may control the first and second organic photoelectric conversion devices PD2 and PD4 and the first and second semiconductor photoelectric conversion devices PD1 and PD3. As described above with reference to FIG. 6, the pixel circuit layer 105 may include parts of the first and second transfer transistors TX1 and TX2, the first reset transistor RX1, the first source-follower transistor SX1, the first selection transistor AX1, or the like which drive the semiconductor photoelectric conversion device PD1. Additionally, the pixel circuit layer 105 may include the second and third reset transistors RX2 and RX3, the second and third source-follower transistors SX2 and SX3, the second and third selection transistors AX2 and AX3, or the like which drive the first and second organic photoelectric conversion devices PD3 and PD4.

As such, the pixel 100a may include a structure in which the first and third photoelectric devices PD1 and PD3 respectively formed in the two pixel areas R4 and R5 share the first floating diffusion FD1. Additionally, since the pixel 200a includes a stacked photoelectric conversion structure, in which the first and second third semiconductor photoelectric conversion devices PD1 and PD3, and the first and second organic photoelectric conversion devices PD2 and PD4 are stacked with each other, and the first and second color filter layers CF1 and CF2 for transmitting color components different from each other, the pixel 200a may include small pixels and a large light-receiving surface.

FIGS. 9A through 9I are cross-sectional views taken along the line A-A of FIG. 2 illustrating stages in a method of manufacturing the pixel 100a according to embodiments.

Figure 9A:
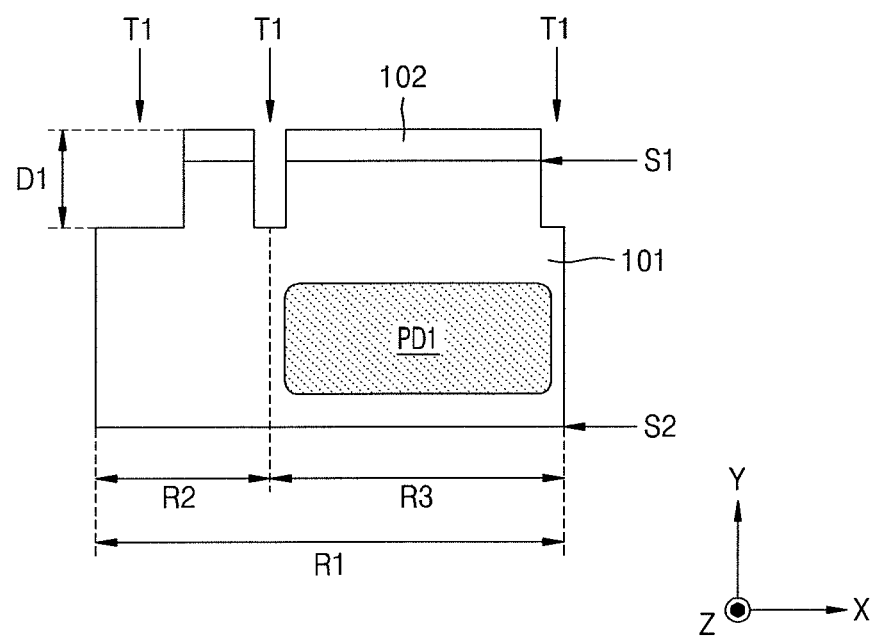
FIGS. 9A through 9I illustrate cross-sectional views taken along the line A-A of FIG. 2 for explaining stages in a method of manufacturing a pixel according to embodiments.

Referring to FIG. 9A, the substrate 101 having the first surface S1 and the second surface S2 which face each other is prepared. A P-type impurity may be doped in the substrate 101, but embodiments are not limited thereto.

The semiconductor photoelectric conversion device PD1 and a well area may be formed by performing an ion injection process on the substrate 101. The semiconductor conversion device PD1 may be formed by doping an N-type impurity in the substrate 101. The semiconductor photoelectric conversion device PD1 may be formed after forming the pixel separator 118 in a follow-up process. A first mask pattern 102 is formed on the first surface S1. A first trench T1 having a first depth D1 is formed by etching the substrate 101 adjacent to the first surface S1 by using the first mask pattern 102 as an etching mask.

Figure 9B:
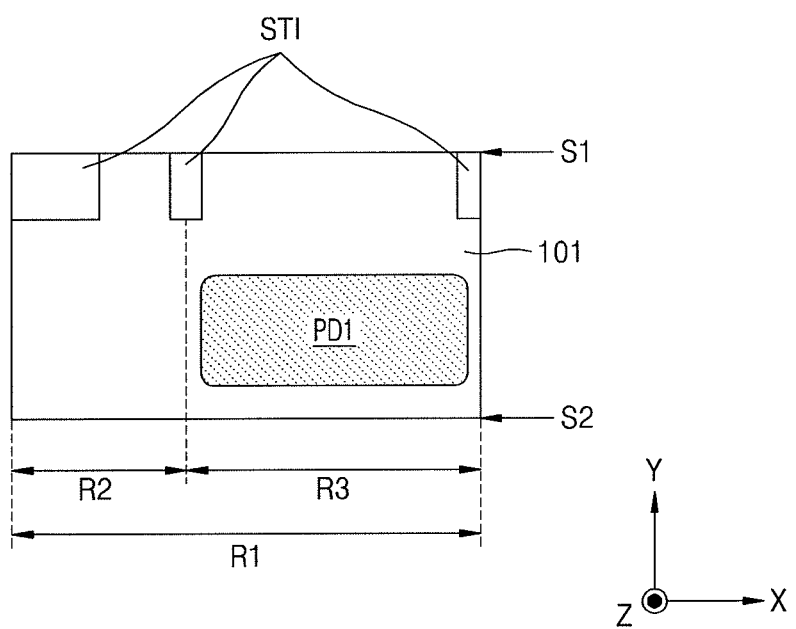

Referring to FIG. 9B, an insulating layer filling the first trench T1 is formed, and a planarization process is performed. Thus, the first surface S1 is exposed, and a shallow device separation layer ST1 is formed.

Figure 9C:
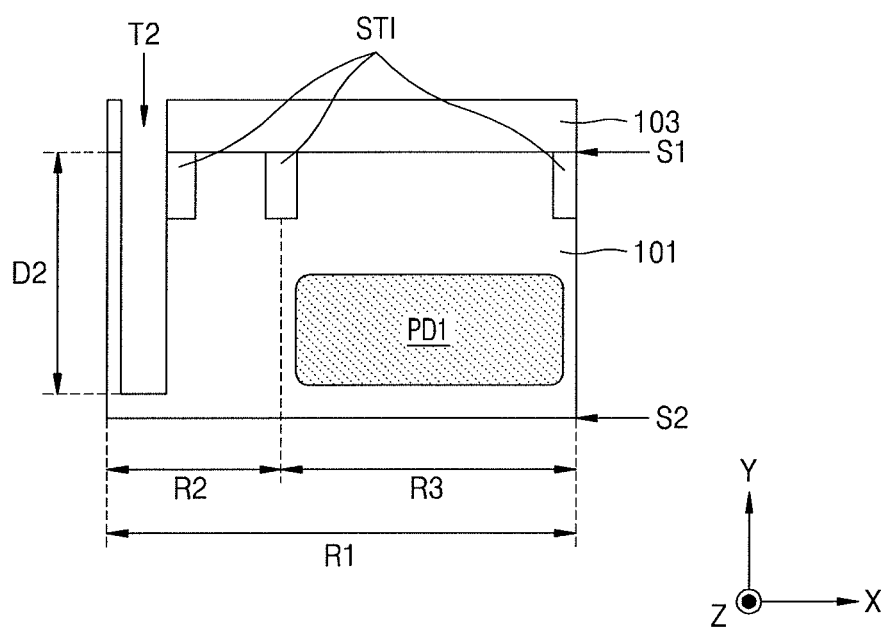

Referring to FIG. 9C, a second mask pattern 103 covering the first surface S1 and defining the pixel area R1 is formed. A second trench T2 having a second depth D2 may be formed by etching the shallow device separating layer STI and the substrate 101 by using the second mask pattern 103 as an etching mask.

Figure 9D:
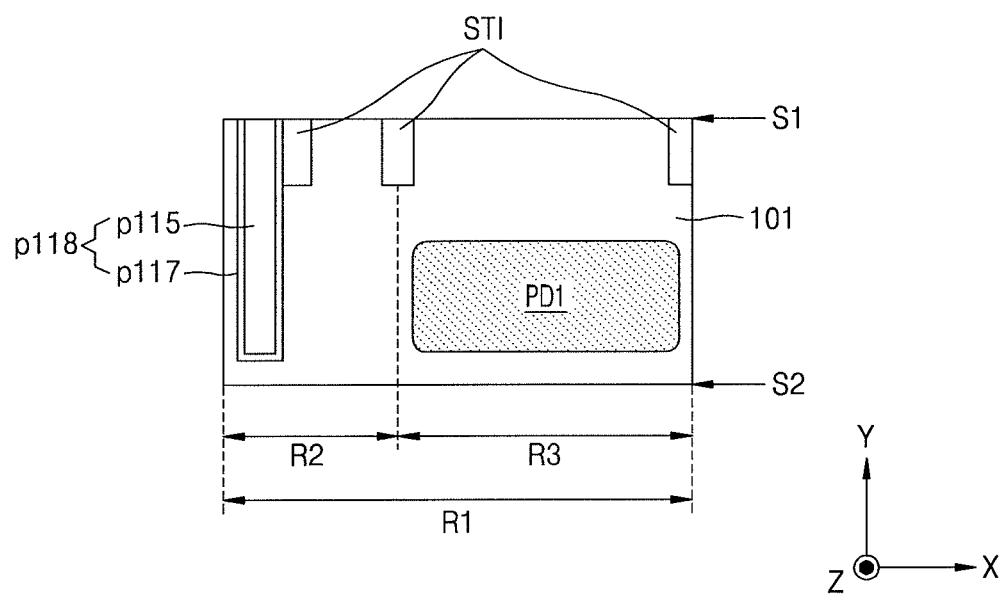

Referring to FIG. 9D, the second mask pattern 103 is removed, and then, an insulating layer p117 is formed to conformally cover a sidewall and a floor of the second trench T2. The second trench T2 is filled with a conductive layer p115. Then, the first surface S1 may be exposed by performing a planarization etching process. Thus, a preliminary pixel separator p118 may be formed in the second trench T2.

Figure 9E:
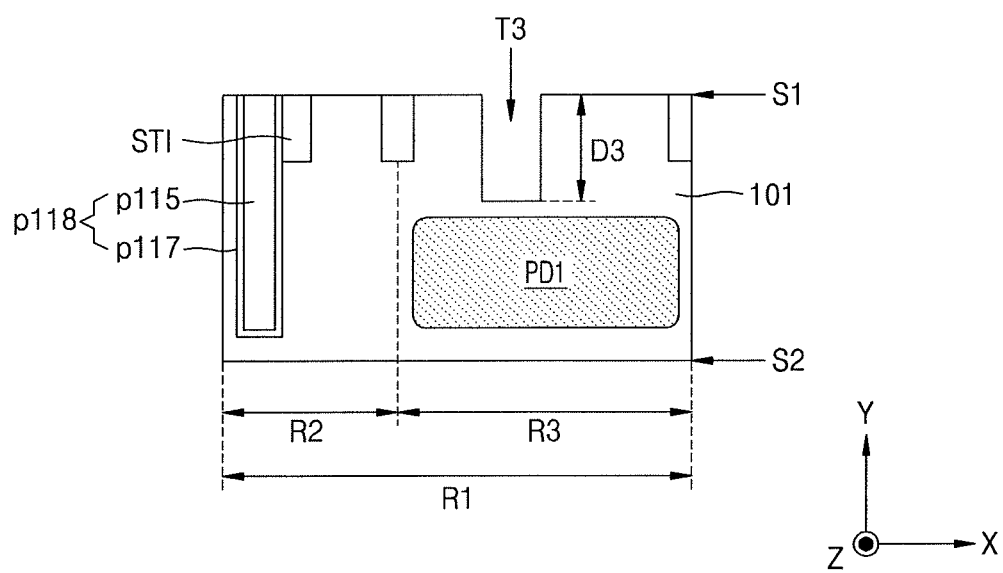
Figure 9F:
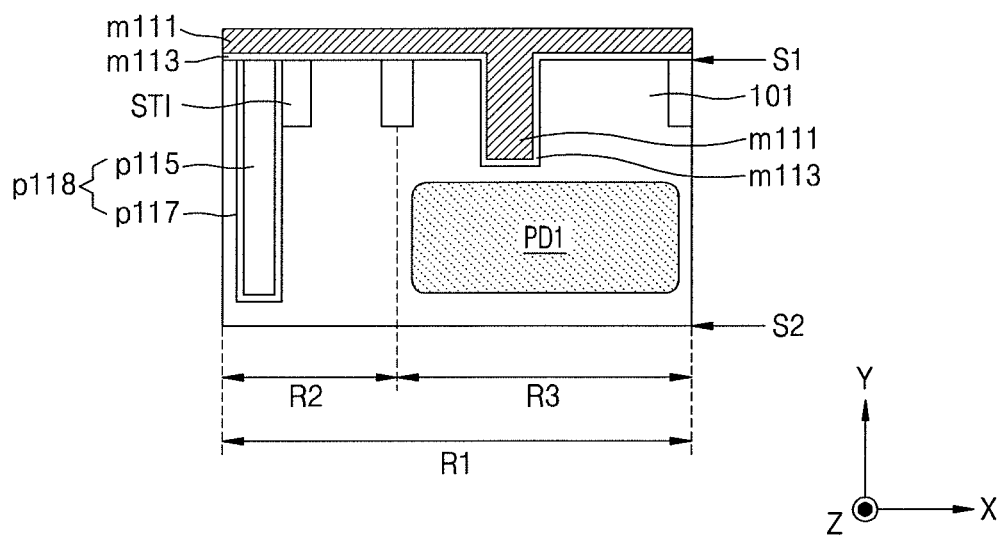

Referring to FIGS. 9E and 9F, a third trench T3 having a third depth D3 may be formed on the first surface S1. A gate dielectric layer m113 and a transfer gate electrode material m111 may cover a sidewall and a floor of the third trench T3, as well as the first surface S1.

Figure 9G:
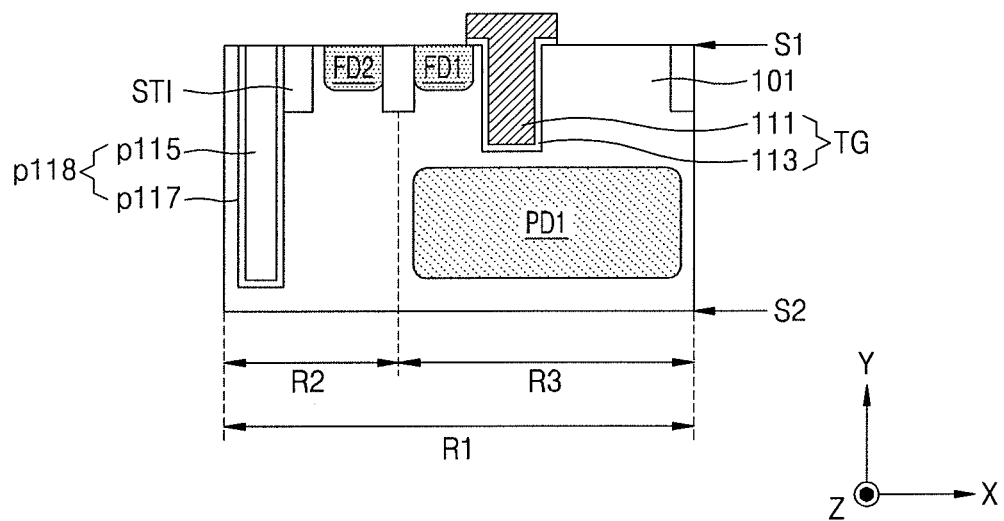

Referring to FIG. 9G, the gate dielectric layer m113 and the transfer gate electrode material m111 may be etched to form the transfer gate electrode TG. Then, an ion injection process may be performed to form the first floating diffusion FD1 in an area adjacent to the transfer gate electrode TG, a second floating diffusion FD2 in an area adjacent to the preliminary through wiring 115, and a ground area.

Figure 9H:
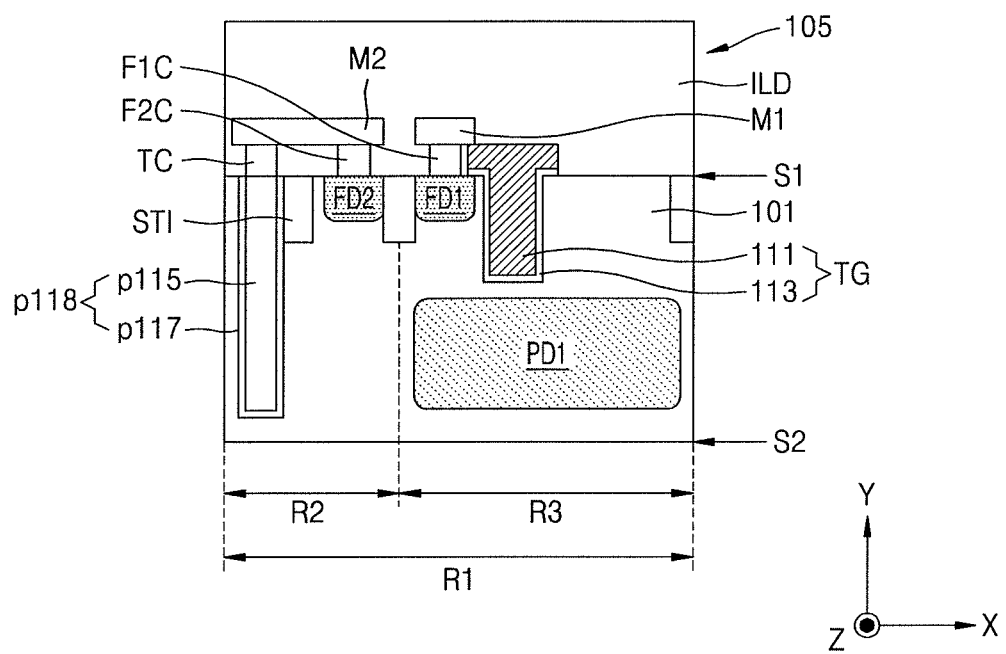

Referring to FIG. 9H, a pixel circuit layer 105 is formed by forming contacts TC, T1C, and T2C, the wirings M1, and interlayer insulating layers ILD.

Figure 9I:
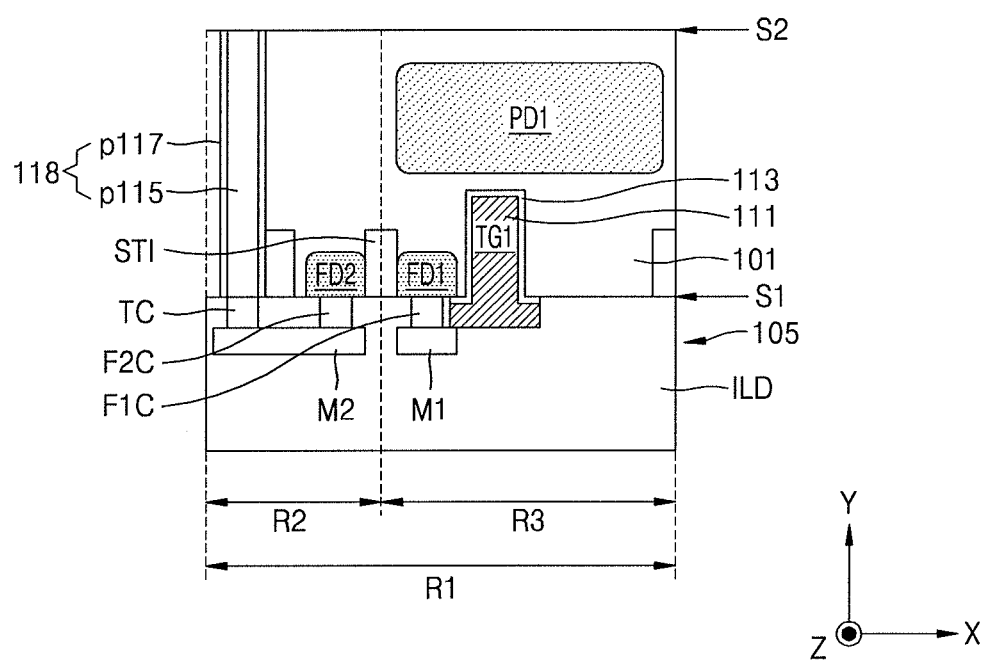

Referring to FIG. 9I, the substrate 101 is turned upside down so that the second surface S2 faces upwards. The conductive layer p115 and the insulating layer p117 may be exposed, by removing a part of the substrate 101 adjacent to the second surface S2 in correspondence with a certain thickness by performing a grinding or chemical mechanical polishing (CMP) process.

Then, referring to FIG. 3, the insulating layer 119 may be formed on the second surface S1, and the color filter layer CF1 may be formed in the insulating layer 119 on the second surface S1. Then, the through wiring 115 may be formed by forming a wiring passing through the insulating layer 119 to connect to the conductive layer p115. Then, the pixel 100a may be manufactured by forming the first electrode 121, the organic photoelectric conversion device PD2, the second electrode 123, and the micro lens layer 125 on the insulating layer 119 and the through wiring 115.

Figure 10:
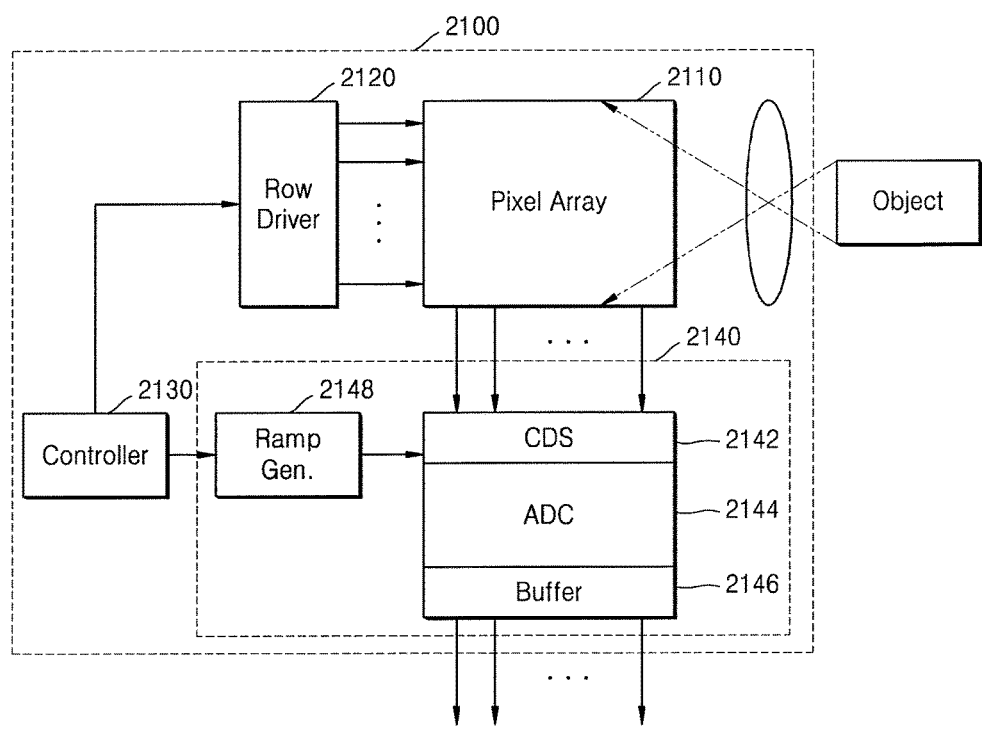
FIG. 10 illustrates a block diagram of an image sensor according to embodiments.

FIG. 10 is a block diagram of an image sensor 2100 according to embodiments. Referring to FIG. 10, the image sensor 2100 may include a pixel array 2110, a controller 2130, a row driver 2120, and a pixel signal processor 2140. According to the embodiments described above, the pixel array 2110 may include the pixel 100, 100a, 200, or 200a shown in FIG. 1, 2, 3, 6, or 8, or the pixel array 1000 shown in FIG. 4. In other words, a pixel may include an organic photoelectric conversion device and a semiconductor photoelectric conversion device. Accordingly, a size of the pixel for outputting an image may decrease, and thus, a clear image may be output.

The pixel array 2110 may include a plurality of pixels arranged two-dimensionally (2D), and each of the pixels may include a light sensing device. The light sensing device may absorb light and generate electric charges. An electrical signal (an output voltage) generated by the generated electrical charges may be provided to the pixel signal processor 2140 via a vertical signal line. The plurality of pixels included in the pixel array 2110 may successively provide, in units of rows, respective output voltages. Accordingly, pixels that belong to a row of the pixel array 2110 may be activated at a same time according to a selection signal output by the row driver 2120. A pixel that belongs to a selected row may be provided to an output line in a column corresponding to an output voltage according to absorbed light.

The controller 2130 may control the row driver 2120 so that the pixel array 2110 absorbs light, accumulates electric charges or temporarily stores accumulated electric charges, and outputs an electrical signal, generated according to the stored electric charges, to the outside of the pixel array 2110. Additionally, the controller 2130 may control the pixel signal processor 2130 to measure an output voltage provided by the pixel array 2110.

The pixel signal processor 2140 may include a correlated double sampler (CDS) 2142, an analog-to-digital converter (ADC) 2144, and a buffer 2146. The CDS 2142 may sample and hold an output voltage provided by the pixel array 2110. The CDS 2142 may perform double-sampling on a particular noise level and a level according to a generated output voltage, and output a level corresponding to a difference therebetween. Additionally, the CDS 2142 may receive an input of ramp signals generated by a ramp signal generator 2148, compare the ramp signals to each other, and output a result of the comparing.

The ADC 2144 may convert an analog signal corresponding to a level received by CDS 2142 into a digital signal. The buffer 2146 may latch digital signals, and the latched signals may be sequentially output to the outside of the image sensor 2100, and transmitted to an image processor.

Figure 11:
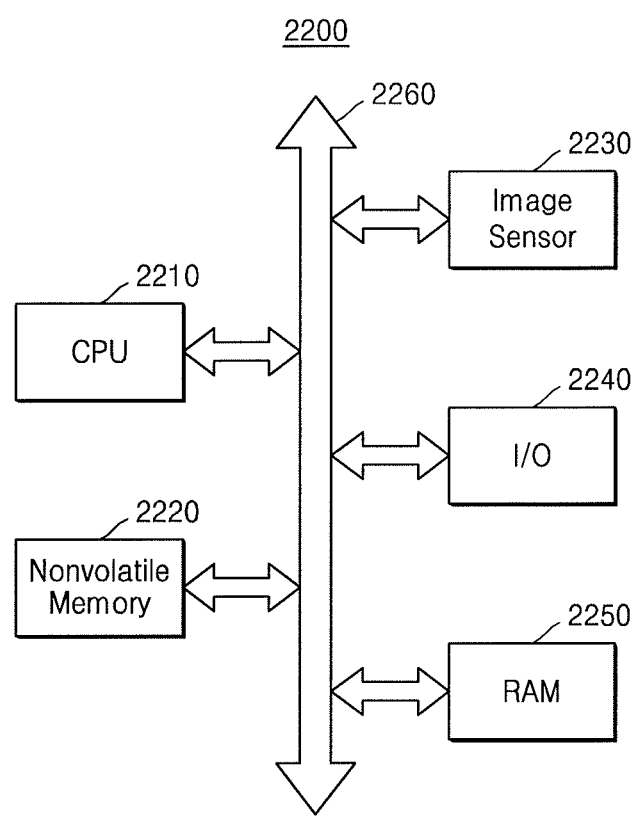
FIG. 11 illustrates a block diagram of a system including an image sensor according to embodiments.

FIG. 11 is a block diagram of a system 2200 including an image sensor according to embodiments. Referring to FIG. 11, the system 2200 may be one of a computing system, a camera system, a scanner, a vehicle navigation system, a video phone, a guard system, and or a motion detection system which need image data.

The system 2200 may include a central processing unit (CPU) (or a processor) 2100, a non-volatile memory 2220, an image sensor 2230, an input/output apparatus 2240, and a random access memory (RAM) 2250. The CPU 2210 may communicate with the non-volatile memory 2200, the image sensor 2230, the input/output apparatus 2240, and the RAM 2250 via a bus 2260. The image sensor 2240 may be implemented as a separate semiconductor chip, or combined with the CPU 2210 to form a semiconductor chip. According to the above-described embodiments, the image sensor 2230 included in the system 2200, shown in FIG. 11, may include the pixel 100, 100a, 200, or 200a shown in FIG. 1, 2, 3, 6, or 8, or the pixel array 100 shown in FIG. 4.

Figure 12:
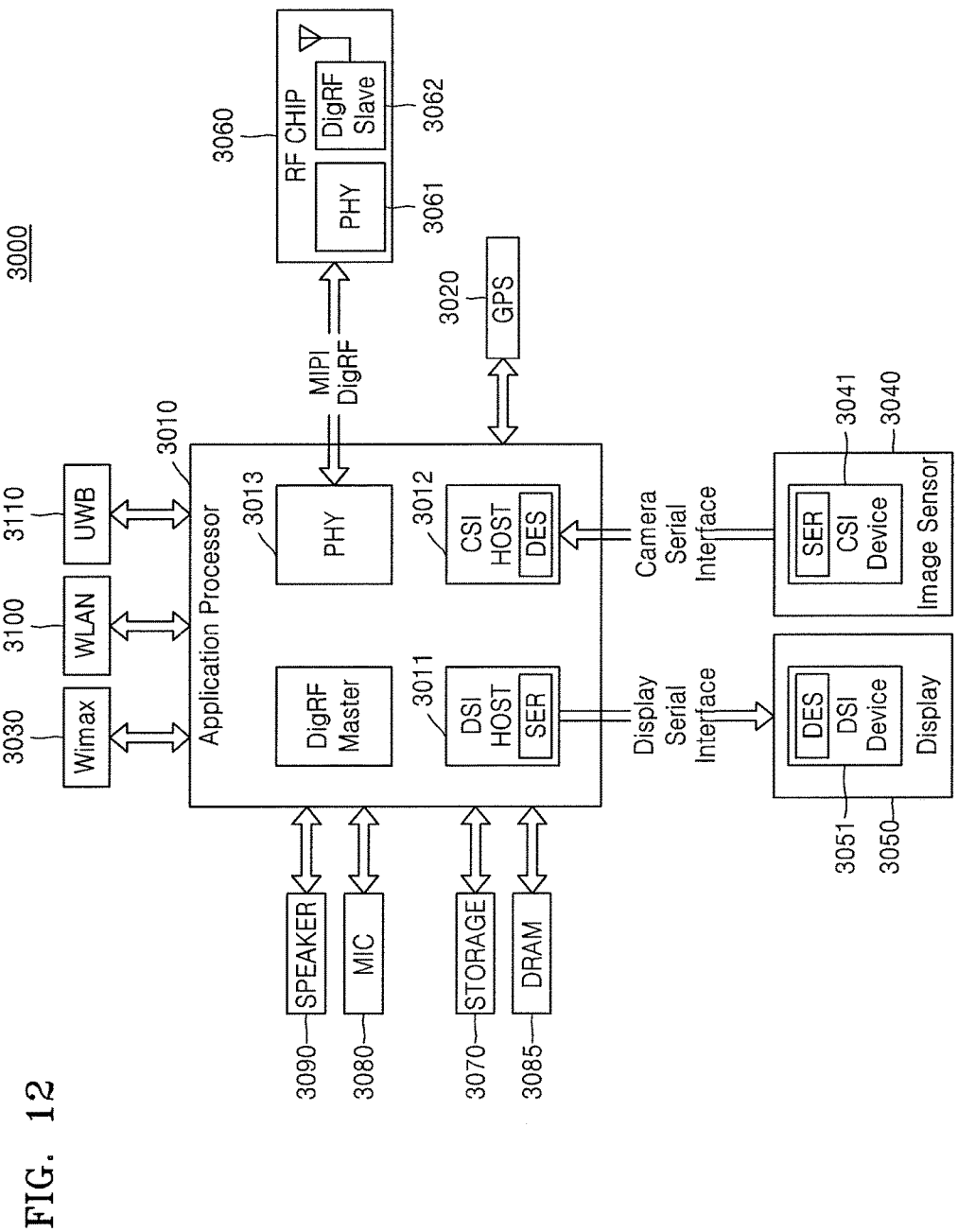
FIG. 12 illustrates a block diagram of an electronic system including an image sensor and an interface according to embodiments.

FIG. 12 is a block diagram of an electronic system 3000 that includes an image sensor and an interface according to embodiments. Referring to FIG. 12, the electronic system 3000 may be implemented as a data processing apparatus that may employ or support a mobile industry interface (MIPI), for example, a mobile phone, a personal digital assistant (PDA), a portable media player (PMP), or a smartphone. The electronic system 3000 may include an application processor 3010, an image sensor 3040, and a display 3050.

A camera serial interface (CSI) host 3012 implemented in the application processor 3010 may perform a serial communication with a CSI apparatus 3041 included in the image sensor 3040 via the CSI. For example, an optical deserializer may be implemented in the CSI host 3012, and an optical serializer may be implemented in the CSI apparatus 3041.

A display serial interface (DSI) host 3011 implemented in the application processor 3010 may perform a serial communication with a DSI apparatus 3051 included in the display 3050 via the DSI. For example, an optical serializer may be implemented in the DSI host 3011, and an optical serializer may be implemented in the DSI apparatus 3051. According to the above-described embodiments, the apparatus that employs light may include the pixel 100, 100a, 200, or 200a shown in FIG. 1, 2, 3, 6, or 8, or the pixel array 1000 shown in FIG. 4.

The electronic system 3000 may further include a radio frequency (RF) chip 3060 that may communicate with the application processor 3010. A physical layer (PHY) 3013 included in the electronic system 3000 and a PHY 3061 included in the RF chip 3060 may transceive data with each other according to MIPI digital radio frequency (DigRF).

The electronic system 3000 may further include a global positioning system (GPS) 3020, a storage 3070, a microphone 3080, a dynamic RAM (DRAM), and a speaker 3090. The electronic system 3000 may communicate with other apparatuses by using worldwide interoperability for microwave access (Wimax) 3030, a wireless local area network (WLAN) 3100, an ultra-wideband (UWB) 3110, or the like.

By way of summation and review, embodiments may provide a photoelectric converter having a light-receiving surface with an increased area, improving the fill factor of the image sensor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
a substrate having a first surface and a second surface, opposite to the first surface, on which light is incident;
a semiconductor photoelectric conversion device in the substrate;
a gate electrode located between the first surface of the substrate and the semiconductor photoelectric conversion device, the gate electrode extending in a first direction perpendicular to the first surface; and
an organic photoelectric conversion device on the second surface of the substrate.

2. The image sensor as claimed in claim 1, wherein:
the first surface extends in a second direction or a third direction, and
a first length of the gate electrode in the first direction is greater than a second length of the gate electrode in a second direction or a third direction.

3. The image sensor as claimed in claim 1, further comprising:
a first floating diffusion adjacent to the gate electrode on the first surface of the substrate and electrically connected to the gate electrode,
wherein the first floating diffusion overlaps the semiconductor photoelectric conversion device in the first direction.

4. The image sensor as claimed in claim 1, further comprising:
a pixel circuit layer on the first surface; and
a through wiring passing through the substrate to electrically connect the organic photoelectric conversion device to the pixel circuit layer.

5. The image sensor as claimed in claim 4, further comprising a second floating diffusion adjacent to the through electrode on the first surface of the substrate and electrically connected to the through electrode,
wherein the second floating diffusion does not overlap the semiconductor photoelectric conversion device in the first direction.

6. The image sensor as claimed in claim 4, further comprising a pixel separator separating a plurality of pixel areas arranged on the substrate from each other,
wherein the through wiring is in the pixel separator.

7. The image sensor as claimed in claim 1, wherein:
the semiconductor photoelectric conversion device is to generate an electron from an electron-hole pair, and
the organic photoelectric conversion device is to generate a hole from an electron-hole pair.

8. The image sensor as claimed in claim 1, further comprising a color filter layer between the substrate and the organic photoelectric conversion device.

9. The image sensor as claimed in claim 8, wherein:
the organic photoelectric conversion device is to convert light in a first wavelength band from light incident on the organic photoelectric conversion device, into a first electrical signal,
the color filter layer is to transmit light in a second wavelength band not converted into an electrical signal by the organic photoelectric conversion device from among the incident light, and
the semiconductor photoelectric conversion device is to convert the light in the second wavelength band into a second electrical signal.

10. The image sensor as claimed in claim 1, wherein:
the semiconductor photoelectric conversion device is to extract an electrical signal from a color component by using four transistors, and
the organic photoelectric conversion device is to extract an electrical signal from a color component by using three transistors.

11. An image sensor, comprising:
a substrate comprising a first surface and a second surface, opposite to the first surface, on which light is incident, and a plurality of pixel areas;
semiconductor photoelectric conversion devices each formed in the plurality of pixel areas of the substrate;

gate electrodes located between the first surface and the semiconductor photoelectric conversion devices and extending in a first direction perpendicular to the first surface in the substrate;

first floating diffusions respectively adjacent to the gate electrodes on the first surface and respectively electrically connected to the gate electrodes in the substrate; and organic photoelectric conversion devices on the second surface, wherein adjacent semiconductor photoelectric conversion devices electrically share the first floating diffusions.

12. The image sensor as claimed in claim 11, wherein:
the first surface extends in a second direction or a third direction, and
a first length of the gate electrodes in the first direction is greater than a second length of the gate electrodes in the second direction or the third direction.

13. The image sensor as claimed in claim 11, further comprising:
a pixel circuit layer on the first surface;
through wirings passing through the substrate and configured to electrically connect the organic photoelectric conversion devices to the pixel circuit layer; and
second floating diffusions adjacent to the through electrodes on the first surface of the substrate and configured to be electrically connected to the through electrodes,
wherein adjacent semiconductor photoelectric conversion devices do not share the second floating diffusions.

14. The image sensor as claimed in claim 13, further comprising a pixel separator separating the plurality of pixel areas of the substrate from each other,
wherein the through wirings are in the pixel separator.

15. The image sensor as claimed in claim 11, wherein:
the semiconductor photoelectric conversion devices include a first semiconductor photoelectric conversion device and a second semiconductor photoelectric device respectively formed in each of the plurality of pixel areas, and
the image sensor further includes a first color filter layer and a second color filter layer respectively arranged on the first and second semiconductor photoelectric conversion devices between the substrate and the organic photoelectric conversion devices,
the organic photoelectric conversion devices are convert light in a first wavelength band, from among light incident on the organic photoelectric conversion devices, into an electrical signal, the first color filter layer is to transmit light in a second wavelength band which is not converted into an electrical signal by the organic photoelectric conversion devices, from among the incident light,
the second color filter layer is to transmit light that is not converted into an electrical signal by the organic photoelectric conversion devices, from among the incident light, in a third wavelength band different from the second wavelength band,
the first semiconductor photoelectric conversion device is to convert the light in the second wavelength band into an electrical signal, and
the second semiconductor photoelectric conversion device is to convert the light in the third wavelength band into an electrical signal.

16. An image sensor, comprising:
a substrate having a first surface and a second surface, opposite to the first surface along a first direction, on which light is incident;
a semiconductor photoelectric conversion device in the substrate and extending in a second direction orthogonal to the first direction;
a gate electrode located between the first surface of the substrate and the semiconductor photoelectric conversion device, the gate electrode extending in the first direction; and
an organic photoelectric conversion device on the second surface of the substrate and extending in the second direction.

17. The image sensor as claimed in claim 16, wherein:
the semiconductor photoelectric conversion device has a largest dimension along the second direction, and
the gate electrode has a largest dimension along the first direction.

18. The image sensor as claimed in claim 16, further comprising a color filter between the substrate and the organic photoelectric conversion device.

19. The image sensor as claimed in claim 18, wherein the color filter completely overlaps the semiconductor photoelectric conversion device along the first direction and partially overlaps the organic photoelectric conversion device along the first direction.

20. The image sensor as claimed in claim 19, further comprising:
a pixel circuit layer on the first surface;
through wiring passing through the substrate and adjacent to the color filter to connect the organic photoelectric conversion device to the pixel circuit layer.

* * * * *